(12) United States Patent
Sulejmanovic et al.

(10) Patent No.: US 11,041,119 B2
(45) Date of Patent: Jun. 22, 2021

(54) EUROPIUM BETA-DIKETONATE LUMINESCENT MATERIAL

(71) Applicant: Jonathan Melman, Shaker Heights, OH (US)

(72) Inventors: Dino Sulejmanovic, Knoxville, TN (US); Jonathan Melman, Lexington, KY (US); Robert Nordsell, Lexington, KY (US); Daniel Bugaris, Lexington, KY (US); Julien Makongo, Lexington, KY (US); Yong Bok Go, Lexington, KY (US)

(73) Assignee: Jonathan Melman, Shaker Heights, OH (US)

( * ) Notice: Subject to any disclaimer, the term of this patent is extended or adjusted under 35 U.S.C. 154(b) by 348 days.

(21) Appl. No.: 16/204,719

(22) Filed: Nov. 29, 2018

(65) Prior Publication Data
US 2019/0161674 A1    May 30, 2019

Related U.S. Application Data

(60) Provisional application No. 62/593,069, filed on Nov. 30, 2017.

(51) Int. Cl.
| | |
|---|---|
| *H01L 51/00* | (2006.01) |
| *C09K 11/06* | (2006.01) |
| *H01L 33/50* | (2010.01) |
| *H01L 51/50* | (2006.01) |
| *C07F 5/00* | (2006.01) |

(52) U.S. Cl.
CPC ............... *C09K 11/06* (2013.01); *C07F 5/00* (2013.01); *C07F 5/003* (2013.01); *H01L 33/502* (2013.01); *H01L 33/504* (2013.01); *H01L 51/009* (2013.01); *H01L 51/0089* (2013.01); *H01L 51/5036* (2013.01); *C09K 2211/1029* (2013.01); *C09K 2211/1044* (2013.01); *C09K 2211/182* (2013.01); *H01L 51/5012* (2013.01)

(58) Field of Classification Search
None
See application file for complete search history.

(56) References Cited

U.S. PATENT DOCUMENTS

| | | | | |
|---|---|---|---|---|
| 3,398,099 A | * | 8/1968 | Kleinerman | ........... C09K 11/06 252/301.18 |
| 7,183,008 B1 | | 2/2007 | Kathirgamanathan | |
| | | (Continued) | | |

FOREIGN PATENT DOCUMENTS

WO    2012/065981 A1    5/2012

OTHER PUBLICATIONS

Melby ey al. "Synthesis and fluorescence of some trivalent lanthanide complexes." Journal of the American Chemical Society 86, No. 23 (1964): 5117-5125. (Year: 1964).*

(Continued)

*Primary Examiner* — Robert S Loewe
(74) *Attorney, Agent, or Firm* — Schmidt Patent Law, Inc.

(57) ABSTRACT

A Europium beta-diketonate molecule comprises Europium with ligands dibenzoylmethane, 1,10-phenanthroline, and methoxide. The molecule is photoluminescent, absorbing light from the ultraviolet region through the blue region and emitting red light characteristic of trivalent europium. The molecule may be used, for example, as a phosphor in a phosphor-converted light-emitting diode.

21 Claims, 9 Drawing Sheets

(56) References Cited

U.S. PATENT DOCUMENTS

| | | |
|---|---|---|
| 8,206,838 B2 | 6/2012 | Marrocco, III et al. |
| 2013/0090460 A1* | 4/2013 | Yamashita ........... C07D 471/04 534/15 |
| 2014/0058073 A1 | 2/2014 | Hoshino et al. |
| 2016/0260857 A1 | 9/2016 | Naumovitz et al. |

OTHER PUBLICATIONS

Martins et al. "Experimental and Theoretical Studies on the Structure and Photoluminescent Properties of New Mononuclear and Homodinuclear Europium (III) β-Diketonate Complexes." Advances in Condensed Matter Physics 2015. (Year: 2015).*

International Search Report corresponding to PCT/US18/63073, dated Feb. 6, 2019, 1 page.

* cited by examiner

EUROPIUM BETA-DIKETONATE LUMINESCENT MATERIAL

CROSS REFERENCE TO RELATED APPLICATIONS

This application claims benefit of priority to U.S. Provisional Patent Application No. 62/593,069 titled "Europium Beta-Diketonate Lumiphore" and filed Nov. 30, 2017, which is incorporated herein by reference in its entirety.

FIELD OF THE INVENTION

The invention relates generally to luminescent materials.

BACKGROUND

Luminescent materials emit light under excitation by electrons, photons, or an electric field. Such materials may be used for example as phosphors, as emitters in light emitting devices, and as biological tags.

SUMMARY

One aspect of the current invention is a family of novel molecules of rare earth ions with ligands of dibenzoylmethane, 1,10-phenanthroline, and methoxide, or with derivatives of these ligands. The molecules are photoluminescent, absorbing light from the ultraviolet region through the blue region and emitting red light characteristic of trivalent europium.

Another aspect of the current invention is a light emitting device comprising one or more of these photoluminescent molecules. The light emitting device may comprise, for example, a light emitting diode, diode laser, or other semiconductor light emitting device that emits light at a wavelength that is absorbed by the molecule, thereby causing the molecule to emit red light.

Another aspect of the current invention is an organic light emitting diode comprising one or more of these novel photoluminescent molecules as an emitter.

Another aspect of the invention is a method of using these novel photoluminescent molecules as phosphor materials, for example in combination with a light emitting diode, laser diode, or other semiconductor device that emits light at a wavelength that is absorbed by the molecule, thereby causing the molecule to emit red light.

Another aspect of the current invention is a method of using these novel photoluminescent molecules as an organic light emitting diode emitter.

Another aspect of the current invention is a method of using these novel photoluminescent molecules as or in a biological tag.

These and other embodiments, features and advantages of the present invention will become more apparent to those skilled in the art when taken with reference to the following more detailed description of the invention in conjunction with the accompanying drawings that are first briefly described.

DETAILED DESCRIPTION

Figure 1:
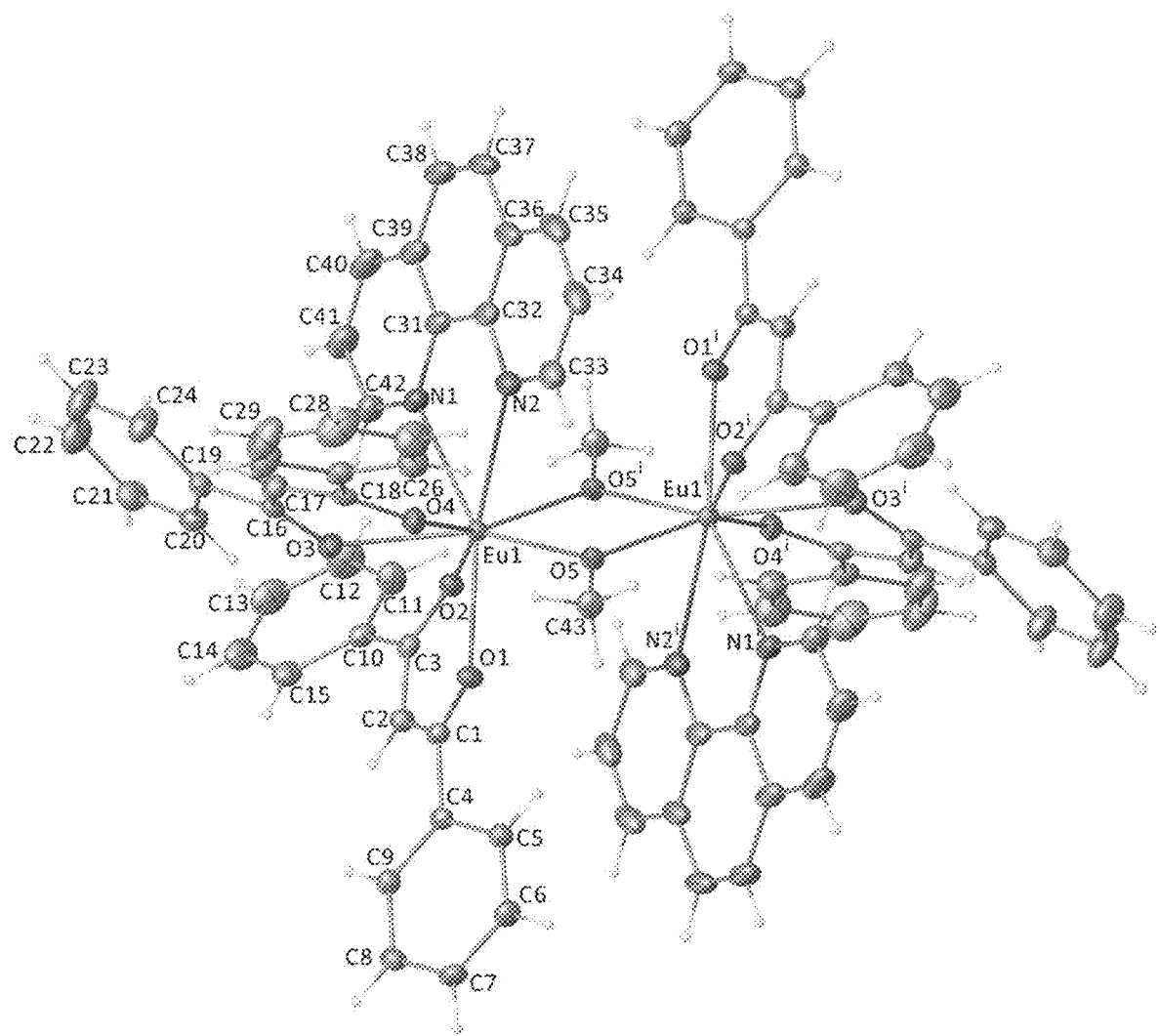
FIG. 1 shows a molecular structure for $Eu_2(C_{15}H_{11}O_2)_4(C_{12}H_8N_2)_2(OCH_3)_2$ from Example 1 as determined by single crystal x-ray diffraction of a triclinic single crystal.

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention.

This specification discloses and characterizes a family of novel photoluminescent Rare Earth beta-diketonate molecules in which a Rare Earth (for example, Praseodymium, Europium, Terbium, or Gadolinium) has ligands of dibenzoylmethane, 1,10-phenanthroline, and methoxide, or derivatives of these ligands.

One example of this family is $Eu_2(C_{15}H_{11}O_2)_4 (C_{12}H_8N_2)_2 (OCH_3)_2$. This molecule is a dimer of $Eu(C_{15}H_{11}O_2)_3(C_{12}H_8N_2)$. As further discussed below, Praseodymium, Terbium and/or Gadolinium may be wholly or partially substituted for the Europium in the $Eu_2 (C_{15}H_{11}O_2)_4 (C_{12}H_8N_2)_2(OCH_3)_2$ molecule.

This specification also discloses methods for synthesizing these molecules, and uses for these molecules. These molecules can be crystalized in a triclinic crystal structure that also comprises solvent molecules, or in an orthorhombic crystal structure that does not comprise solvent molecules.

EXAMPLE SYNTHESES AND PRODUCTS

Example 1

0.420 g (9.95 mmol) of NaOH pellets was weighed and added to 35 mL of anhydrous ethanol (denatured with ca. 13% methanol). The NaOH was allowed to dissolve completely under slow stirring. Dibenzoylmethane (2.21 g, 9.80 mmol) and 1,10-phenanthroline (0.593 g, 3.29 mmol) were weighed and added to the NaOH ethanol solution. The mixture was heated to 60 C and stirred for 2 hours. 0.852 g (3.29 mmol) of anhydrous $EuCl_3$ (handled in a glovebox) was weighed and dissolved in ~3 mL of distilled water. The $EuCl_3$ solution was added dropwise to the NaOH, dibenzoylmethane, 1,10-phenanthroline solution. A pale yellow/white precipitate began forming during the dropwise addition of $EuCl_3$ solution. Following the addition of $EuCl_3$ solution, the product was suspended in 30 mL of dichloromethane (DCM). The mixture was then centrifuged three times to get rid of NaCl impurity. The remaining dichloromethane solution was placed on a hot plate at about 80 C setting to remove dichloromethane. After about 2 hours, a yellow solid was retrieved. This crude product was then used to collect initial PL/PLE data. For crystal growth, the crude product was dissolved in DCM and added to a large 30 mL vial. To this solution, anhydrous ethanol with about 13% methanol was layered on top and the vial was capped and left on the shelf. After 1 day, the two solvent layers fused together. Crystals started growing on the bottom of the vial after about a week. A few crystals were retrieved after 10 days along with the mother liquor for single crystal X-ray diffraction. This synthesis was modified from Dissertation: C M Malba, *Synthesis and characterization of lanthanide based luminescent materials*, 2013, and L. R. Melby, N. J. Rose, E. Abramson, J. C. Caris, *J. Am. Chem. Soc.*, 1964, 86, 5117-5125.

The crystals decompose rapidly when removed from the mother liquor, but can be handled for several minutes under oil. A large colorless block-like crystal was selected, cleaved to size under paratone-N oil, and quickly transferred to the diffractometer cold stream. X-ray intensity data were collected at 100(2) K using a Bruker D8 QUEST diffractometer equipped with a PHOTON-100 CMOS area detector and an Incoatec microfocus source (Mo Kα radiation, λ=0.71073 Å). The raw area detector data frames were reduced and corrected for absorption effects using the Bruker APEX3, SAINT+ and SADABS programs.[1,2] Final unit cell parameters were determined by least-squares refinement of 9992 reflections taken from the data set. The structure was solved with SHELXT.[3] Subsequent difference Fourier calculations and full-matrix least-squares refinement against F2 were performed with SHELXL-2017[3] using OLEX2.[4]

The compound crystallizes in the triclinic system (crystal structure 1). The space group P-1 (No. 2) was confirmed by structure solution. The asymmetric unit consists of half of one $Eu_2(C_{15}H_{11}O_2)_4(C_{12}H_8N_2)_2(OCH_3)_2$ complex located on a crystallographic inversion center, and one dichloromethane molecule. All non-hydrogen atoms were refined with anisotropic displacement parameters. Hydrogen atoms bonded to carbon were located in difference Fourier maps before being placed in geometrically idealized positions and included as riding atoms with d(C—H)=0.95 Å and Uiso (H)=1.2 Ueq(C) for aromatic hydrogen atoms, d(C—H) =0.99 Å and Uiso(H)=1.2 Ueq(C) for methylene hydrogen atoms, and d(C—H)=0.98 Å and Uiso(H)=1.5 Ueq(C) for methyl hydrogens. The methyl hydrogens were allowed to rotate as a rigid group to the orientation of maximum observed electron density. The largest residual electron density peak in the final difference map is 1.75 e-/Å3, located 0.93 Å from C16. It is not chemically significant.

Figure 2:
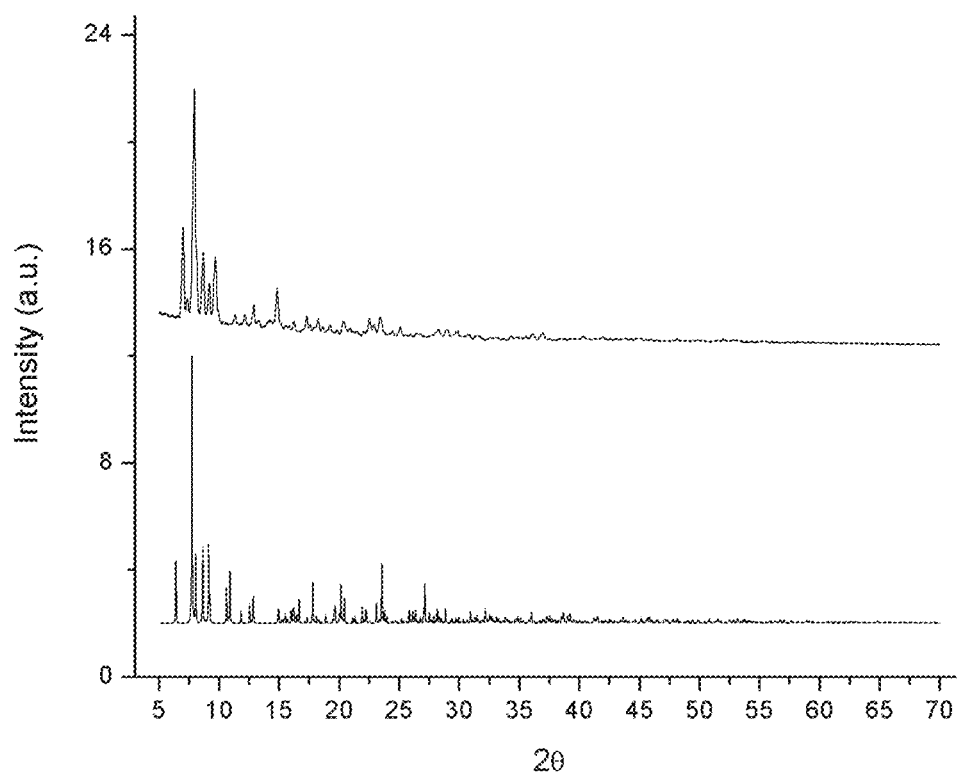
FIG. 2 shows a powder x-ray diffraction pattern for $Eu_2(C_{15}H_{11}O_2)_4(C_{12}H_8N_2)_2(OCH_3)_2$ from Example 1 (upper trace) and a simulation of the powder x-ray diffraction pattern based on the triclinic crystal structure determined by single crystal x-ray diffraction.

Tables 1-7 below summarize crystal structure data for this example. FIG. 1 shows a 50% probability displacement ellipsoid plot of the molecular structure, with some atom labels omitted. The complex is located on crystallographic inversion center. Superscripts denote symmetry-equivalent atoms, symmetry code (i)=-x+1, -y+1, -z+1. FIG. 2 shows a powder x-ray diffraction pattern for the product (upper trace) and a simulation of the powder x-ray diffraction pattern based on the crystal structure determined by single crystal x-ray diffraction.

Figure 3:
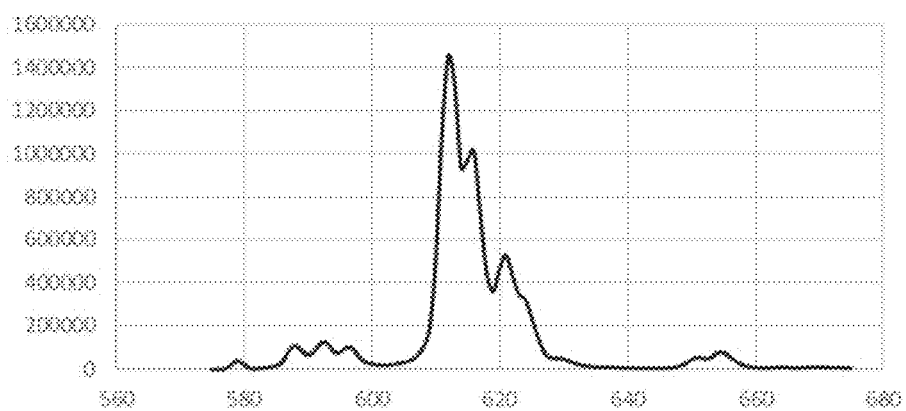
FIG. 3 shows an emission spectrum from a single triclinic crystal of $Eu_2(C_{15}H_{11}O_2)_4(C_{12}H_8N_2)_2(OCH_3)_2$ from Example 1.
Figure 4:
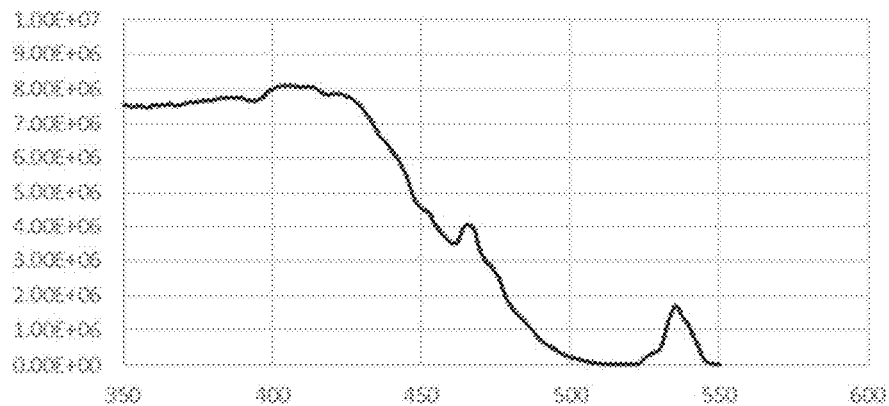
FIG. 4 shows an excitation spectrum from a single triclinic crystal of $Eu_2(C_{15}H_{11}O_2)_4(C_{12}H_8N_2)_2(OCH_3)_2$ from Example 1.

FIG. 3 shows an emission spectrum from a single crystal with excitation at 405 nanometers. Excitation at 450 nanometers produces essentially the same emission spectrum, differing only in the absolute intensity of the emission. FIG. 4 shows an excitation spectrum from a single crystal measured with emission detected at 620 nanometers with a slit-width of 14 nanometers (effectively covering the region between 613 nanometers and 627 nanometers).

Example 2

0.485 g (12.1 mmol) of NaOH pellets was weighed and added to 50 mL of methanol. NaOH was allowed to dissolve completely under slow stirring. Dibenzoylmethane (1.245 g, 5.552 mmol) was added to the NaOH methanol solution, once dissolved, the solution was heated to 80 C and 1,10-phenanthroline (0.6474 g, 3.593 mmol) was added to the reaction solution; the vessel was covered loosely to prevent solvent evaporation. The mixture was stirred for 2 hours. 1.347 g (3.020 mmol) of europium nitrate hexahydrate was weighed and dissolved separately in 10 mL of methanol; the solution was also heated to 80 C. The NaOH, dibenzoylmethane, 1,10-phenanthroline methanol solution was added dropwise to the europium nitrate solution. A pale yellow/white precipitate began forming during the dropwise addition. The methanol was allowed to evaporate on an 80 C hot plate for approximately 2 hours. The yellowish, creamy product was washed with approximately 400 mL of deionized water, and collected in a filter. The solids were further washed with approximately 100 mL of water and then approximately 40 mL of methanol. The solids were dissolved off of the filter with approximately 40 mL of dichloromethane. The solvent was allowed to evaporate overnight. In the morning, the solids were dissolved in 10 mL dichloromethane, and the solution was centrifuged and decanted to remove any insoluble material. The dicholormethane solution was layered with an equal volume of methanol and capped tightly for crystal growth.

X-ray diffraction data indicated that the product crystallized in a crystal structure that was isostructural by unit cell analysis with crystals of the product from example 1. The inventors thus conclude that the product from example 2 crystalized in a triclinic crystal structure comprising dichloromethane solvent molecules.

Example 3

0.4 g (9.88 mmol) of NaOH was dissolved in methanol with a Teflon stir bar and slow stirring at ~200 rpm at 60° C. 2.21 g (9.80 mmol) of Dibenzoylmethane and 0.593 g (3.29 mmol) of 1,10-phenanthroline were weighed and added to the NaOH methanol solution. The mixture was stirred for 2 hours.

Separately, 0.852 g (3.29 mmol) of $EuCl_3$ was weighed and dissolved in ~3 mL of methanol. Yellowish precipitate was formed upon dropwise addition of $EuCl_3$ solution to the NaOH solution. The resulting yellow precipitate was dissolved upon adding ~30 mL of dichloromethane, and a white precipitate of NaCl settled out at the bottom of the flask after 10-20 min. The white precipitate was filtered out and the yellow liquid was centrifuged three times at 2200 rpm for 2 min to settle the remaining NaCl impurity.

The yellow concentrate solution was divided into 2 parts: 15 ml was placed in a crystal growth vial in which another 15 ml of methanol was slowly added. Yellow crystals were collected after 2 weeks for the PL measurements. The emission spectrum was characteristic of a monomer.

The remaining yellow concentrated solution was heated at 60° C. to evaporate the solvents and after about 2 hours a yellow solid was obtained. The crude product was dissolved in 30 ml $CH_2Cl_2$ and the resulted yellow liquid was divided into 2 equal parts of about 15 ml each in a crystal growth vial.

In each crystal growth vial another 15 ml of methanol was slowly added. Yellow crystals started growing after 2 days and the crystal growth was complete after three weeks. Almost 0.8 g of crystals were collected by evaporating the remaining solvent overnight under the fume wood.

Single crystal x-ray intensity data from a pale yellow plate were collected at 100(2) K using a Bruker D8 QUEST diffractometer equipped with a PHOTON-100 CMOS area detector and an Incoatec microfocus source (Mo Kα radiation, λ=0.71073 Å). The raw area detector data frames were reduced and corrected for absorption effects using the Bruker APEX3, SAINT+ and SADABS programs. Final unit cell parameters were determined by least-squares refinement of 9708 reflections taken from the data set. The structure was solved with SHELXT.[3] Subsequent difference Fourier calculations and full-matrix least-squares refinement against $F^2$ were performed with SHELXL-2018[3] using OLEX2.[4]

The compound crystallizes in the orthorhombic system (crystal structure 2). The pattern of systematic absences in the intensity data was uniquely consistent with the space group Pbca, which was confirmed by structure solution. The asymmetric unit consists of half of one $Eu_2(C_{15}H_{11}O_2)_4$ $(C_{12}H_8N_2)_2(OCH_3)_2$ complex, which is located on a crystallographic inversion center. All non-hydrogen atoms were refined with anisotropic displacement parameters.

Hydrogen atoms bonded to carbon were located in Fourier difference maps before being placed in geometrically idealized positions and included as riding atoms with d(C—H)= 1.00 Å and Uiso(H)=1.2 Ueq(C) for methine hydrogen atoms and d(C—H)=0.98 Å and Uiso(H)=1.5 Ueq(C) for methyl hydrogens. The methyl hydrogens were allowed to rotate as a rigid group to the orientation of maximum observed electron density. The largest residual electron density peak in the final difference map is 1.75 e⁻/Å³, located 0.86 Å from Eu1.

Tables 8-13 below summarize crystal structure data for this example.

Example 4

0.572 g NaOH was placed in a 100 mL beaker with 50 mL of MeOH, along with a Teflon stir bar. The beaker was placed on a hot stir plate and covered with a watch glass. The flask was stirred at 200-300 rpm for approximately 60 minutes while heating at approximately 75° C. The stirring speed was increased to 300-400 rpm before adding 2.217 g dibenzoylmethane to the beaker, followed by 0.900 g 1,10-phenanthroline. Stirring was continued until a clear yellow solution was obtained (approximately 120 minutes). The pH of the solution was monitored with pH paper and controlled to pH ~8. In a separate beaker, 2.217 g europium nitrate hexahydrate was dissolved in ~10 mL of methanol. The europium/methanol solution was added dropwise to the ligand solution. The beaker containing the europium solution was rinsed with another 2-5 mL methanol which was added to the ligand solution. The reaction solution was stirred for another 1-2 hours uncovered. This allowed the methanol to evaporate leaving behind a mixture of europium complex and sodium chloride.

The product was transferred to a 1 L beaker, 400-600 mL of deionized water was added and the mixture was sonicated for 5-15 minutes (to dissolve the sodium chloride byproduct). The solid product was isolated via vacuum filtration, and rinsed thoroughly with an additional 200-1000 mL of deionized water. The pH, as indicated by pH paper, was 5-7. The product was rinsed with approximately 40 mL of methanol and the solid sample allowed to dry on filter paper.

The crude yellowish product was dissolved in about 40 mL of dichloromethane. The solution was split between two 20 mL vials, and centrifuged at least three times for 10 minutes at 2200 rpm. The solutions were removed from the vial via pipet and combined in a beaker, which was heated overnight to drive off the dichloromethane and leave approximately 3 g of yellow-orange gel like powder.

The product was dissolved in 30 mL dichloromethane. 10 mL of this solution was placed in a tall vial and layered with an equal volume of methanol. Crystals having the triclinic crystal structure of the product of example 1 grew as well as crystals of the orthorhombic crystal structure. Crystals were larger than 50 microns.

Example 5

The synthesis was similar to example 4, however 2.5 g of crude product were dissolved in 40 mL of dichloromethane and 10 mL of solution was layered with an equal volume of methanol. Crystals only of the orthorhombic structure formed. Crystals were smaller than 50 micron.

Example 6

The synthesis was similar to example 4, however 0.2 g of cruder product was dissolved in 10 mL acetone and that solution was layered with an equal volume of methanol. Micron sized crystals of having the orthorhombic structure were obtained.

Example 7

The synthesis was similar to example 4, however europium chloride hexahydrate was used instead of europium nitrate.

Example 8

The synthesis was similar to example 7, however a mixture of 95% europium and 5% terbium salts were used.

Example 9

The synthesis was similar to example 7, however a mixture of 95% gadolinium and 5% europium salts were used.

Example 10

The synthesis was similar to example 7, however a praseodymium salt was used. This produced crystals of triclinic structure which were not luminescent.

Figure 5:
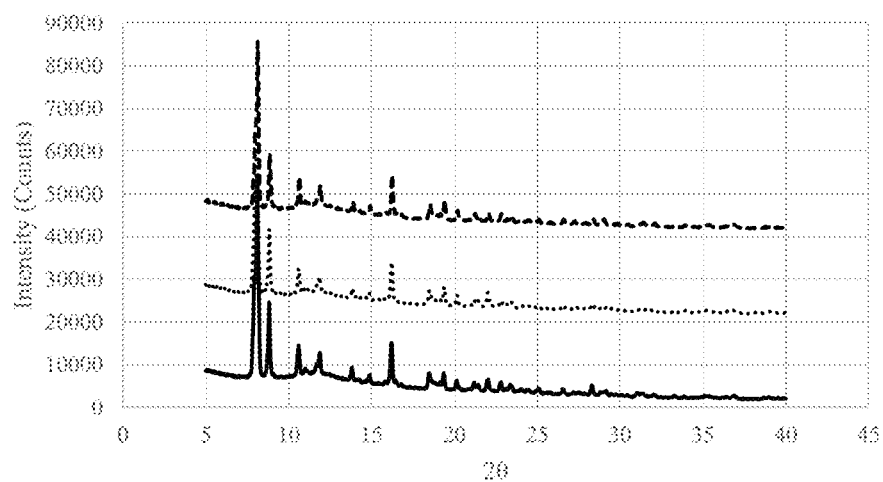
FIG. 5 shows powder x-ray diffraction patterns for orthorhombic crystal structure $Eu_2(C_{15}H_{11}O_2)_4(C_{12}H_8N_2)_2(OCH_3)_2$ from Example 4 (dashed line), Example 5 (dotted line), and Example 6 (solid line).
Figure 6:
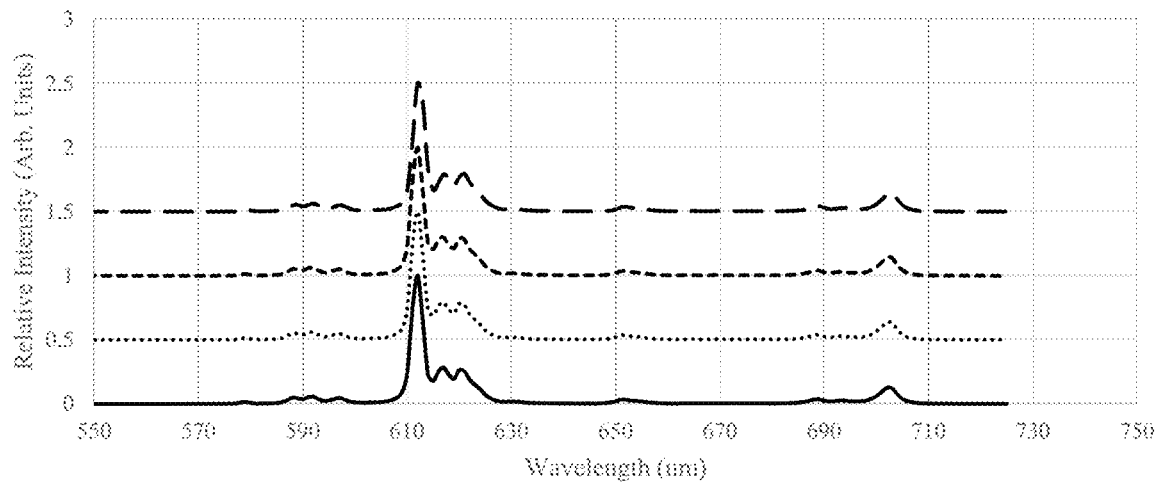
FIG. 6 shows emission spectra from single orthorhombic crystals of $Eu_2(C_{15}H_{11}O_2)_4(C_{12}H_8N_2)_2(OCH_3)_2$ from Example 3 (long dashed line), Example 4 (short dashed line), Example 5 (dotted line), and Example 6 (solid line).
Figure 7:
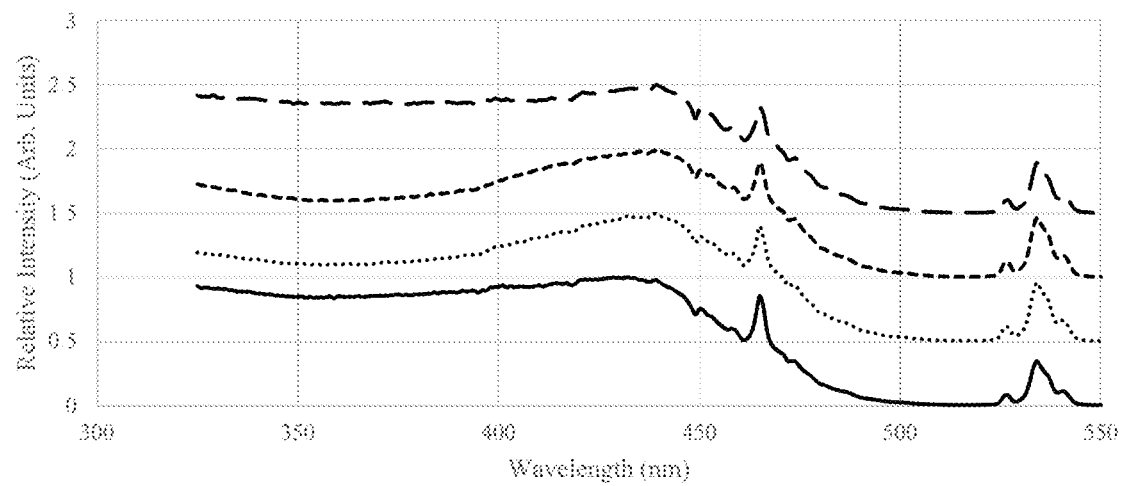
FIG. 7 shows excitation spectra from single orthorhombic crystals of $Eu_2(C_{15}H_{11}O_2)_4(C_{12}H_8N_2)_2(OCH_3)_2$ from Example 3 (long dashed line), Example 4 (short dashed line), Example 5 (dotted line), and Example 6 (solid line).
Figure 8:
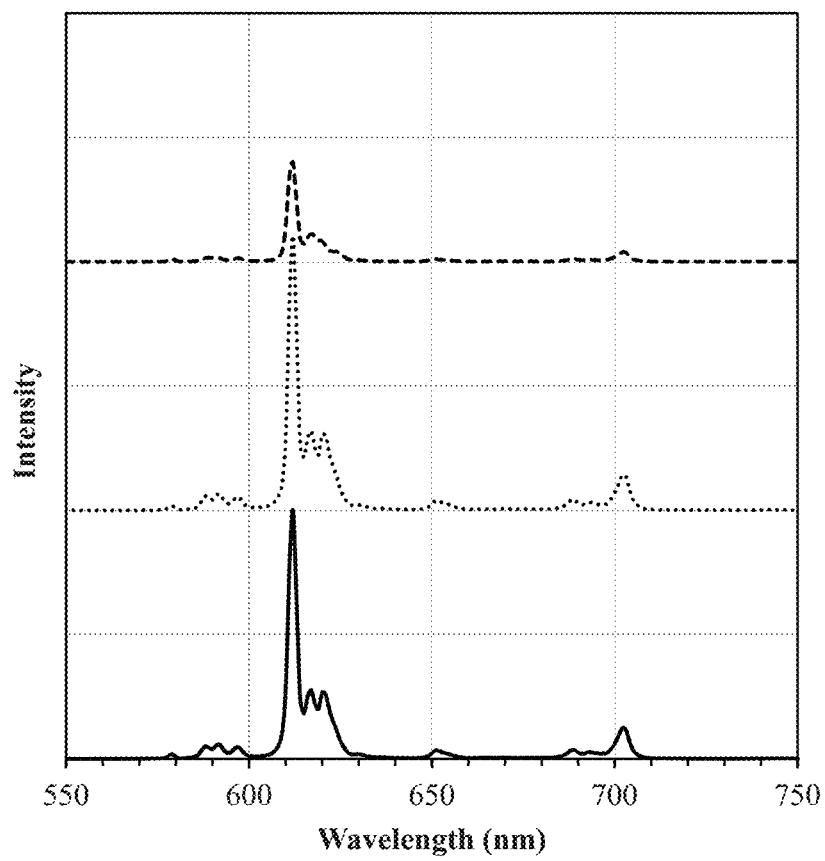
FIG. 8 shows emission spectra from a single crystal of $Eu_2(C_{15}H_{11}O_2)_4(C_{12}H_8N_2)_2(OCH_3)_2$ from Example 7 (solid line), a single crystal of $(Eu_{1.9}Tb_{0.1})(C_{15}H_{11}O_2)_4(C_{12}H_8N_2)_2(OCH_3)_2$ from Example 8 (dotted line), and a single crystal of $(Eu_{0.1}Gd_{1.9})(C_{15}H_{11}O_2)_4(C_{12}H_8N_2)_2(OCH_3)_2$ from Example 9 (dashed line) excited with light of 420 nm.
Figure 9:
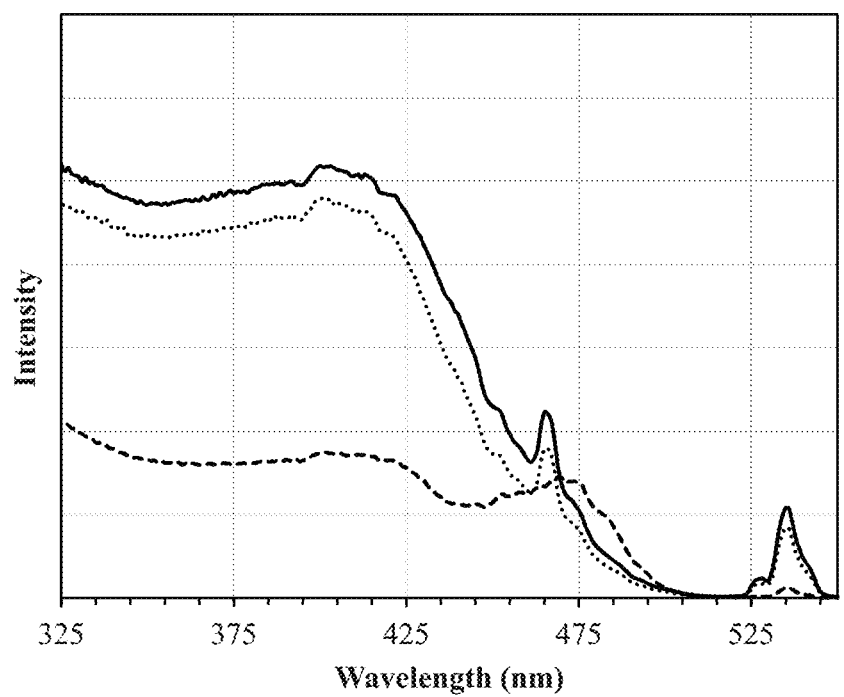
FIG. 9 shows excitation spectra from a single crystal of $Eu_2(C_{15}H_{11}O_2)_4(C_{12}H_8N_2)_2(OCH_3)_2$ from Example 7 (dotted line), a single crystal of $(Eu_{1.9}Tb_{0.1})(C_{15}H_{11}O_2)_4(C_{12}H_8N_2)_2(OCH_3)_2$ from Example 8 (solid line), and a single crystal of $(Eu_{0.1}Gd_{1.9})(C_{15}H_{11}O_2)_4(C_{12}H_8N_2)_2(OCH_3)_2$ From Example 9 (dashed line) monitored at 612 nm.

FIG. 5 shows a powder x-ray diffraction pattern for the products of examples 4-6. FIG. 6 shows emission spectra from single crystals from examples 3-6 for excitation at 440 nm. FIG. 7 shows excitation spectra from single crystals from examples 3-6 for emission detected at 612 nm with a slit width of 14. FIG. 8 shows emission spectra from single crystals from examples 7-9 for excitation at 420 nm. FIG. 9 shows excitation spectra from single crystals from examples 7-9 for emission detected at 612 nm with a slit width of 14.

Figure 10:
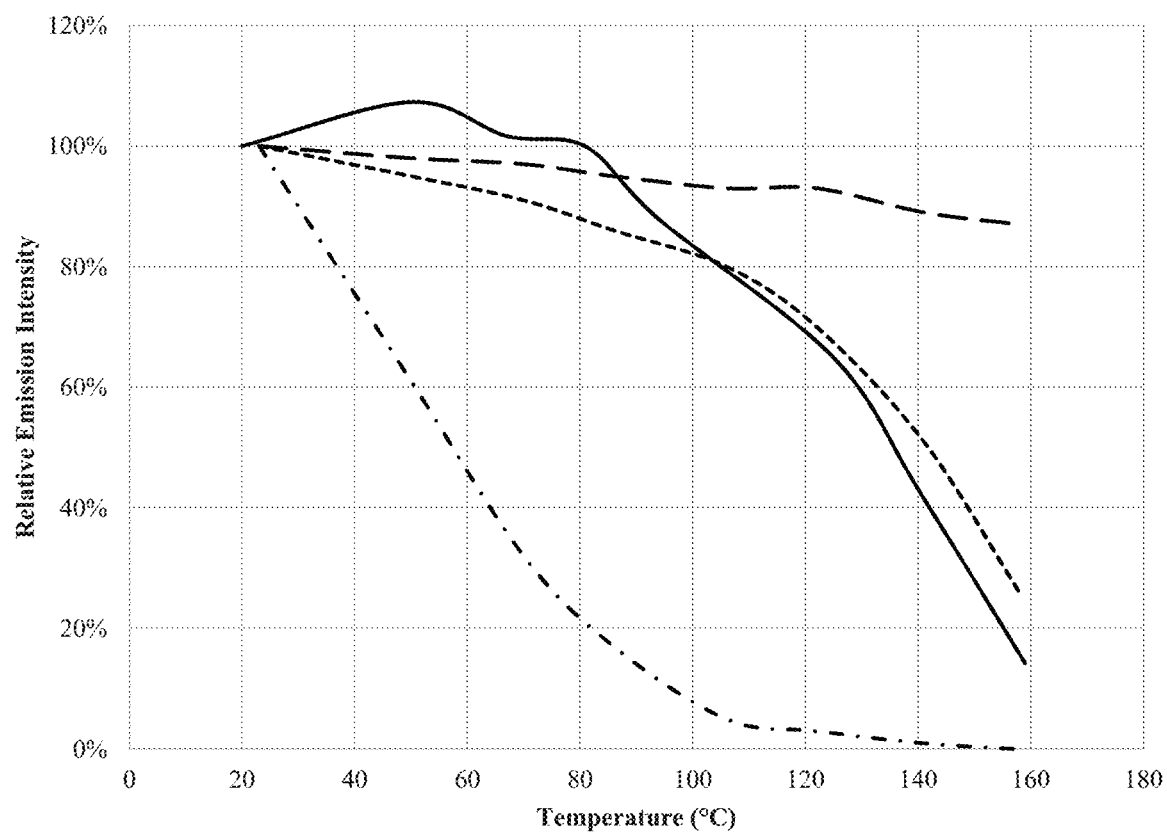
FIG. 10 is a plot of relative emission intensity versus temperature showing thermal quenching of powders of triclinic crystal structure $Eu_2(C_{15}H_{11}O_2)_4(C_{12}H_8N_2)_2(OCH_3)_2$ (solid line) orthorhombic crystal structure $Eu_2(C_{15}H_{11}O_2)_4(C_{12}H_8N_2)_2(OCH_3)_2$ (short dashed line), the monomer $Eu(C_{15}H_{11}O_2)_3(C_{12}H_8N_2)$ (dash-dot line), and a red emitting CASN phosphor (long dashed line).

Thermal quenching of powders of the triclinic crystal structure product, the orthorhombic crystal structure product, the commercially available monomer $Eu(C_{15}H_{11}O_2)_3(C_{12}H_8N_2)$ were measured against the Calcium Aluminum Silicon Nitride (CASN) red phosphor BR-102Q available from Mitsubishi Chemical in a typical photoluminescence intensity measurement as a function of temperature. The results are shown in FIG. 10. Both the triclinic product and the orthorhombic product show far less quenching than the monomer.

Fabrication of Phosphor-Converted LEDs

The phosphors of the present invention may be optically coupled with an excitation source in any conventional manner. One of the more common methods is to combine green emitting phosphors, with a red phosphor and optional blue and/or yellow phosphors. The phosphors may be combined together and then added to an encapsulant, such as silicone, epoxy, or some other polymer, or the phosphors may be combined during their addition to the encapsulant. The phosphor loaded encapsulant may then be placed in the optical path of an excitation source, such as an LED or laser diode that emits ultraviolet, violet, or blue light. One common method is to deposit the slurry of phosphor or phosphors into an LED (light emitting diode) package which contains an LED die. The slurry is then cured forming an encapsulated LED package. Other methods include forming the encapsulant into a shape or coating the encapsulant onto a substrate which may already be in a particular shape, or may be subsequently formed into a particular shape. Additionally, the phosphor containing encapsulant may be disposed on or near (e.g., coated on) the in-coupling region of a light guide, or on the out-coupling region of a light guide, such as a light guide intended for use in a display. Alternatively, the phosphor composition may be deposited as a thin film on the LED die or on another substrate and subsequently optically coupled to the light source. The combination of an excitation source and the phosphors of the present invention may be used in general lighting, niche lighting applications, display backlighting, or other lighting applications.

Figure 11:
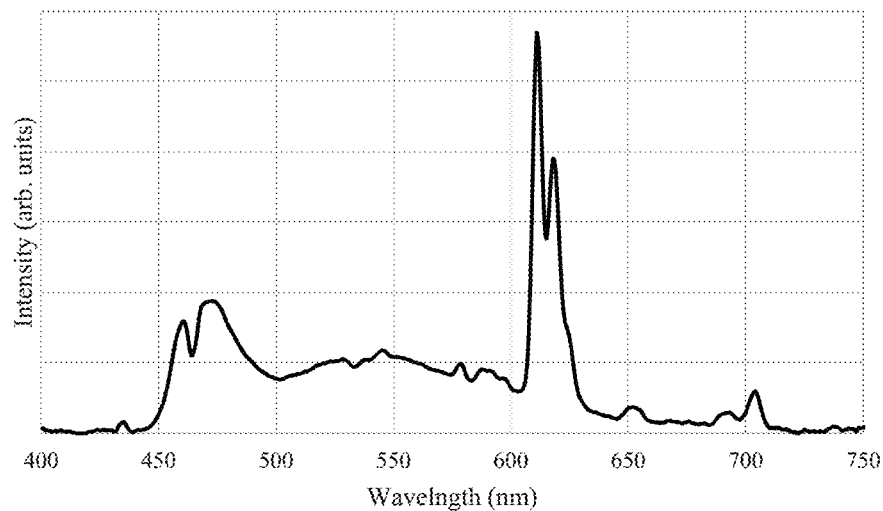
FIG. 11 shows an emission spectrum from an example phosphor-converted LED comprising a $Eu_2(C_{15}H_{11}O_2)_4(C_{12}H_8N_2)_2(OCH_3)_2$ red phosphor.

A phosphor-converted white light LED was fabricated from a PowerOpto blue LED, and a phosphor mixture prepared from 4.4 mg of Merck RGA 540 500 green phosphor and 29.4 mg of $Eu_2(C_{15}H_{11}O_2)_4(C_2H_8N_2)_2(OCH_3)_2$ red phosphor of crystal structure 2 dispersed in 147.1 mg of Dow Corning OE6550 A&B silicone. FIG. 11 shows the emission from this phosphor-converted LED, which is white with CIE x,y color coordinates 0.384, 0.373, color temperature 3875K, duv~0.003, CRI~79.4, and R9~64.1.

Figure 12:
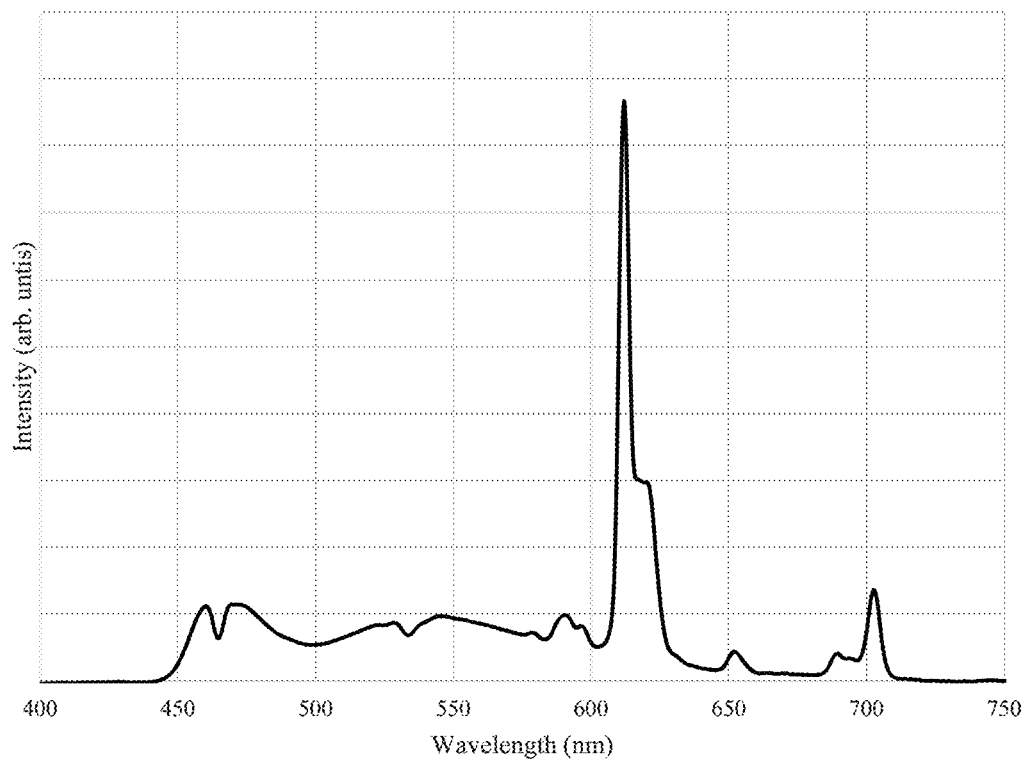
FIG. 12 shows an emission spectrum from another example phosphor-converted LED comprising a $Eu_2(C_{15}H_{11}O_2)_4(C_{12}H_8N_2)_2(OCH_3)_2$ red phosphor.

Another phosphor-converted white light LED was fabricated from a PowerOpto blue LED, and a phosphor mixture prepared from 4.5 mg of Merck RGA 540 500 green phosphor and 46.7 mg of $Eu_2(C_{15}H_{11}O_2)_4(C_{12}H_8N_2)_2(OCH_3)_2$ red phosphor of crystal structure 2 dispersed in Dow Corning OE6550 A&B silicone. FIG. 12 shows the emission from this phosphor-converted LED, which is white with CIE x,y color coordinates 0.429, 0.389, color temperature 3017K, duv~0.005, CRI~79.3, and R9~36.7.

Figure 13:
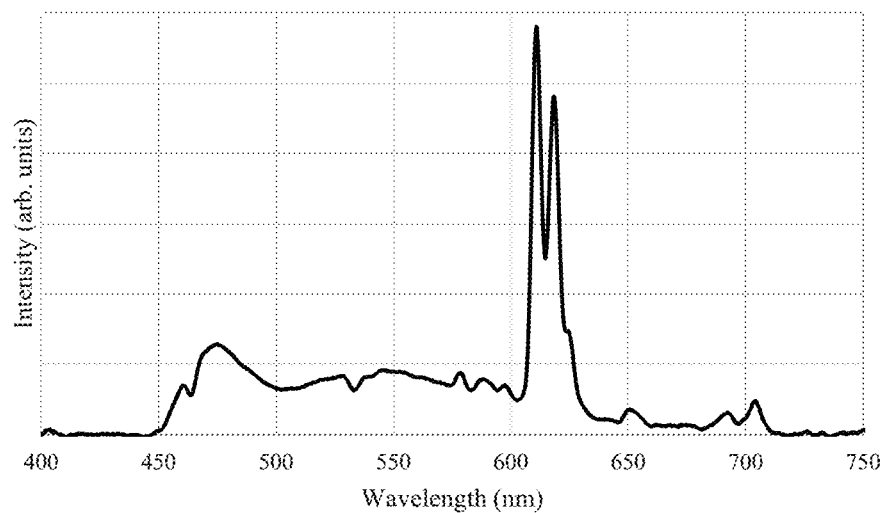
FIG. 13 shows an emission spectrum from another example phosphor-converted LED comprising a $Eu(C_{15}H_{11}O_2)_3(C_{12}H_8N_2)$ red phosphor.

Another phosphor-converted white light LED was fabricated from a PowerOpto blue LED, and a phosphor mixture prepared from 1.3 mg of Merck RGA 540 500 green phosphor and 19.6 mg of $Eu(C_{15}H_{11}O_2)_3(C_2H_8N_2)$ red phosphor dispersed in Dow Corning OE6550 A&B silicone. FIG. 13 shows the emission from this phosphor-converted LED, which is white with CIE x,y color coordinates 0.434, 0.397, color temperature 3002K, duv~0.002, CRI~75.6, and R9~48.8. This phosphor-converted white light LED made with the monomer has a CRI that is 4 points lower than the phosphor-converted white light LED made with $Eu_2(C_{15}H_{11}O_2)_4(C_{12}H_8N_2)_2(OCH_3)_2$ at the same nominal color temperature.

Figure 14:
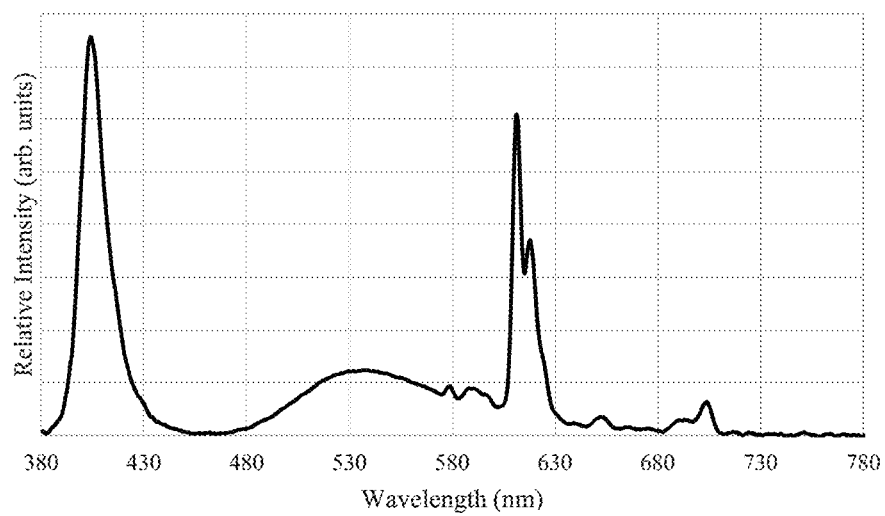
FIG. 14 shows an emission spectrum from another example phosphor-converted LED comprising a $Eu_2(C_{15}H_{11}O_2)_4(C_{12}H_8N_2)_2(OCH_3)_2$ red phosphor.

Another phosphor-converted white light LED was fabricated from a Vishay violet (405 nm) LED, and a phosphor mixture prepared from 4.4 mg of Merck RGA 540 200 green phosphor and ¾ mg of $Eu_2(C_{15}H_{11}O_2)_4(C_{12}H_8N_2)_2(OCH_3)_2$ red phosphor of crystal structure 2 dispersed in 53 mg of Dow Corning OE6550 A&B silicone. FIG. 14 shows the emission from this phosphor-converted LED, which is white with CIE x,y color coordinates 0.423, 0.411, color temperature 3296K, duv~0.005, CRI~84.6, and R9~21.5.

Use in Organic Light Emitting Diodes

The family of molecules disclosed herein may be used as red emitters in an organic light emitting diode system. In general, an organic LED can be made with a first electrode layer on a substrate and a second electrode layer above the first electrode layer. An emitting layer is disposed between the first electrode layer and the second electrode layer. Additional layers may also be included between electrode layers and the emitting layer, such as electron transport regions, hole transport regions, or interlayers. The emitting layer comprises emitter molecules disposed as dopants in a host material. The following is a non-limiting list of potential host materials: tris(8-quinolinolato)aluminum (Alq3), 4,4'-bis(N-carbazolyl)-1,1'-biphenyl (CBP), poly(n-vinylcarbazole) (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethylbiphenyl (CDBP), or 2-methyl-9,10-bis(naphthalen-2-yl)anthracene (MADN).

Blue, green and red colors may be generated by inclusion of dopants in the host material. Blue emission may be enabled by a fluorescent material such as, but not limited to, spiro-DPVBi, spiro-6P, distyryl-benzene (DSB), distyryl-arylene (DSA), a polyfluorene (PFO)-based polymer, and a poly(p-phenylene vinylene) (PPV)-based polymer. Blue emission may also be enabled by a phosphorescent material such as, but not limited to, $(4,6-F2ppy)_2Ir(pic)$. Green emission may be enabled by a fluorescent materials such as, but not limited to, tris(8-hydroxyquinolino)aluminum (Alq3). Green emission may also be enabled by a phosphorescent material such as, but not limited to, fac-tris(2-phenylpyridine)iridium $(Ir(ppy)_3)$. Red emission may be enabled by the red emitting molecules disclosed herein.

Use as Biological Tags

Derivatives of the photoluminescent molecules disclosed herein may be used as a fluorescent label or a so-called biological tag. There is a need for fluorescent compounds which exhibit high stability in water and affinity for specific analytes. Additionally, it is useful to have a compound whose excitation and emission properties exhibit little variation with temperature. The photoluminescent molecules disclosed herein exhibit these properties, aside from an ability to chemically link to specific analytes. It is possible to utilize derivatives of the exemplary ligand system (dibenzoylmethane and 1, 10 phenanthroline) which create linkages to biological systems, but do not disrupt the emission capabilities. For example, a simple modification of the phenanthroline to 5-amino phenanthroline (available from Sigma Aldrich) creates the ability of the present invention to bind to certain biological functionalities. Additionally, the commercial availability of 5-chloro phenanthroline, 1,10-Phenanthroline-5,6-dione, 4,7-Dihydroxy-1,10-phenanthroline, and 4,7-Dichloro-1,10-phenanthroline (available from Sigma Aldrich) enables chemical modification of the phenanthroline to incorporate a linkage chemistry of choice. Preparation of derivatives of the beta-diketonate ligand to facilitate biological linkages is also possible, for example from 1,3-Bis(4-chlorophenyl)propane-1,3-dione, 1-(4-Methoxyphenyl)-3-p-tolylpropane-1,3-dione, 2-Bromo-1-(4-chlorophenyl)-3-phenylpropane-1,3-dione, 2-Bromo-1,3-bis(4-chlorophenyl)propane-1,3-dione, 2-Bromo-1-(4-chlorophenyl)-3-p-tolylpropane-1,3-dione, 1-(2-Hydroxyphenyl)-3-phenylpropane-1,3-dione, or 1-(4-Chlorophenyl)-3-(2-hydroxyphenyl)propane-1,3-dione (available from Heterocyclics, Inc., Edison, N.J.).

One of ordinary skill in the art will know that certain substitutions may be made in the solvents, dibenzoylmethane, 1,10-phenanthroline, or methoxide used in preparation of the materials described herein without fundamentally altering the structure, and ultimately the utility, of the compositions.

TABLE 1

Crystal data and structure refinement for Example 1.

| | |
|---|---|
| Empirical formula | C88H70Cl4Eu2N4O10 |
| Formula weight | 1789.20 |
| Temperature/K | 100(2) |
| Crystal system | triclinic |
| Space group | P-1 |
| a/Å | 12.0030(7) |
| b/Å | 12.1026(7) |
| c/Å | 14.5266(8) |
| α/° | 95.202(2) |
| β/° | 105.269(2) |
| γ/° | 106.417(2) |
| Volume/Å3 | 1921.42(19) |
| Z | 1 |
| ρcalcg/cm3 | 1.546 |
| μ/mm−1 | 1.820 |
| F(000) | 900.0 |
| Crystal size/mm3 | 0.38 × 0.22 × 0.18 |
| Radiation | MoKα (λ = 0.71073) |
| 2Θ range for data collection/° | 3.566 to 56.694 |
| Index ranges | −16 ≤ h ≤ 16, −16 ≤ k ≤ 16, −19 ≤ l ≤ 19 |
| Reflections collected | 60218 |
| Independent reflections | 9566 [Rint = 0.0267, Rsigma = 0.0217] |
| Data/restraints/parameters | 9566/0/489 |
| Goodness-of-fit on F2 | 1.123 |
| Final R indexes [I >= 2σ (I)] | R1 = 0.0248, wR2 = 0.0520 |
| Final R indexes [all data] | R1 = 0.0302, wR2 = 0.0541 |
| Largest diff. peak/hole/e Å−3 | 1.75/−0.78 |

TABLE 2

Fractional Atomic Coordinates (×104) and Equivalent Isotropic Displacement Parameters (Å2 × 103) for Example 1. (Ueq is defined as ⅓ of the trace of the orthogonalised UIJ tensor).

| Atom | x | y | z | U(eq) |
|---|---|---|---|---|
| Eu1 | 3956.5(2) | 5176.0(2) | 3841.0(2) | 13.88(4) |
| O1 | 5083.7(13) | 4733.2(12) | 2814.9(10) | 16.5(3) |
| O2 | 5112.4(13) | 6947.2(12) | 3529(1) | 16.4(3) |
| O3 | 2738.3(13) | 5501.1(13) | 2361.7(11) | 18.9(3) |
| O4 | 2313.7(13) | 3420.5(13) | 3026.7(11) | 18.4(3) |
| O5 | 4766.2(13) | 3877.3(12) | 4616.6(10) | 15.4(3) |
| N1 | 2782.3(16) | 6613.0(17) | 4262.0(13) | 21.6(4) |
| N2 | 2545.3(16) | 4581.1(17) | 4968.6(13) | 21.0(4) |
| C1 | 5570.9(18) | 5270.3(17) | 2237.4(15) | 15.0(4) |
| C2 | 5662.2(18) | 6434.5(18) | 2139.1(15) | 16.4(4) |
| C3 | 5381.3(18) | 7190.5(17) | 2767.6(15) | 15.1(4) |
| C4 | 6094.7(18) | 4593.3(17) | 1649.9(14) | 14.5(4) |
| C5 | 6390.1(19) | 3635.9(18) | 1983.5(15) | 17.7(4) |
| C6 | 6882(2) | 2978.8(19) | 1470.5(16) | 20.7(4) |
| C7 | 7058.8(19) | 3253.5(19) | 602.0(16) | 21.0(4) |
| C8 | 6760.9(19) | 4197.3(19) | 253.4(15) | 19.4(4) |
| C9 | 6295.9(18) | 4872.2(18) | 780.0(15) | 17.1(4) |
| C10 | 5401.4(18) | 8385.5(18) | 2561.0(16) | 17.5(4) |
| C11 | 5600(2) | 9269.2(19) | 3327.4(18) | 25.7(5) |
| C12 | 5492(2) | 10347(2) | 3154(2) | 33.4(6) |
| C13 | 5167(2) | 10546(2) | 2213(2) | 32.8(6) |
| C14 | 4980(2) | 9683(2) | 1445.7(19) | 28.9(5) |
| C15 | 5108(2) | 8606.1(19) | 1618.3(17) | 20.9(4) |
| C16 | 1596.4(19) | 5146.8(18) | 1971.6(14) | 16.5(4) |
| C17 | 838.4(19) | 4016.3(19) | 1948.5(16) | 19.7(4) |
| C18 | 1243.0(18) | 3203.2(18) | 2456.6(15) | 16.1(4) |
| C19 | 1065.4(19) | 6034.3(19) | 1535.3(15) | 18.6(4) |
| C20 | 1856(2) | 7065.7(19) | 1415.5(16) | 20.8(4) |
| C21 | 1433(2) | 7955(2) | 1086.4(17) | 25.9(5) |
| C22 | 206(2) | 7842(2) | 888(2) | 32.3(6) |
| C23 | −592(2) | 6828(2) | 1010(2) | 36.5(6) |
| C24 | −170(2) | 5927(2) | 1325.0(19) | 28.7(5) |
| C25 | 367.3(19) | 2006.0(18) | 2375.6(16) | 19.1(4) |
| C26 | 675(2) | 1314(2) | 3054.0(18) | 25.1(5) |
| C27 | −120(2) | 214(2) | 3020(2) | 33.9(6) |
| C28 | −1232(2) | −215(2) | 2298(2) | 39.8(7) |
| C29 | −1540(2) | 455(2) | 1613(2) | 37.9(6) |
| C30 | −750(2) | 1553(2) | 1647.6(19) | 26.9(5) |
| C31 | 2157.2(19) | 6421(2) | 4922.3(16) | 22.8(5) |
| C32 | 2026.0(19) | 5342(2) | 5292.6(16) | 23.6(5) |
| C33 | 2415(2) | 3589(2) | 5304.3(17) | 25.3(5) |
| C34 | 1770(2) | 3284(2) | 5971.5(17) | 31.3(6) |
| C35 | 1250(2) | 4048(3) | 6297.9(18) | 34.3(6) |
| C36 | 1366(2) | 5109(2) | 5963.7(17) | 29.7(6) |
| C37 | 866(2) | 5970(3) | 6278.9(18) | 37.5(7) |
| C38 | 1004(2) | 6980(3) | 5945.9(19) | 37.0(7) |
| C39 | 1642(2) | 7237(2) | 5245.9(17) | 29.8(5) |

TABLE 2-continued

Fractional Atomic Coordinates (×10⁴) and Equivalent Isotropic Displacement Parameters (Å² × 10³) for Example 1. (Ueq is defined as ⅓ of the trace of the orthogonalised UIJ tensor).

| Atom | x | y | z | U(eq) |
|---|---|---|---|---|
| C40 | 1772(2) | 8261(2) | 4852.0(19) | 34.6(6) |
| C41 | 2378(2) | 8444(2) | 4175.1(19) | 32.5(6) |
| C42 | 2879(2) | 7594(2) | 3904.7(17) | 25.6(5) |
| C43 | 4623(2) | 2752.8(18) | 4143.2(16) | 21.0(4) |
| Cl1 | 2143.9(7) | 1038.2(6) | 1288.9(6) | 46.30(18) |
| Cl2 | 3512.9(6) | 2277.6(5) | 121.5(4) | 30.87(13) |
| C44 | 2924(2) | 2426(2) | 1101.7(18) | 28.2(5) |

TABLE 3

Anisotropic Displacement Parameters (Å² × 10³) for Example 1. The Anisotropic displacement factor exponent takes the form: $-2\pi^2[h^2a^{*2}U11 + 2hka^*b^*U12 + \ldots]$.

| Atom | U11 | U22 | U33 | U23 | U13 | U12 |
|---|---|---|---|---|---|---|
| Eu1 | 14.77(5) | 14.48(5) | 14.13(6) | 2.58(4) | 5.51(4) | 6.25(4) |
| O1 | 19.6(7) | 14.4(7) | 18.1(7) | 3.4(6) | 9.0(6) | 6.0(6) |
| O2 | 19.3(7) | 15.1(7) | 15.9(7) | 2.2(6) | 6.1(6) | 6.3(6) |
| O3 | 15.0(7) | 21.7(8) | 19.8(8) | 5.2(6) | 5.4(6) | 4.8(6) |
| O4 | 16.9(7) | 18.6(7) | 18.2(7) | 3.6(6) | 3.1(6) | 5.2(6) |
| O5 | 19.4(7) | 13.1(7) | 14.5(7) | 0.4(5) | 5.2(6) | 6.7(6) |
| N1 | 18.1(9) | 28.2(10) | 19.9(9) | 0.9(8) | 4.9(7) | 11.4(8) |
| N2 | 16.4(8) | 28(1) | 17.2(9) | 2.4(8) | 5.1(7) | 5.2(7) |
| C1 | 13.3(9) | 15.1(9) | 16.3(10) | 1.4(8) | 4.3(8) | 4.6(7) |
| C2 | 17.4(10) | 16(1) | 17.4(10) | 4.0(8) | 6.7(8) | 6.0(8) |
| C3 | 12.8(9) | 12.9(9) | 17.7(10) | 2.0(8) | 2.6(8) | 3.4(7) |
| C4 | 13.6(9) | 14.5(9) | 14.0(9) | −0.1(7) | 3.4(7) | 3.7(7) |
| C5 | 18.9(10) | 18(1) | 17.2(10) | 3.2(8) | 5.8(8) | 7.0(8) |
| C6 | 22.8(11) | 19.6(10) | 22.5(11) | 3.8(9) | 6.6(9) | 11.0(9) |
| C7 | 20.5(10) | 23.3(11) | 21.8(11) | −0.6(9) | 8.5(9) | 10.6(9) |
| C8 | 18.4(10) | 24.8(11) | 15.8(10) | 2.3(8) | 7.9(8) | 6.0(8) |
| C9 | 16.8(10) | 15.9(10) | 17.9(10) | 2.5(8) | 4.5(8) | 4.9(8) |
| C10 | 15.7(9) | 13.0(9) | 24.6(11) | 3.6(8) | 7.6(8) | 4.6(8) |
| C11 | 30.1(12) | 17.5(11) | 27.4(12) | 1.2(9) | 5.1(10) | 8.7(9) |
| C12 | 39.0(14) | 15.1(11) | 43.7(16) | −1.3(10) | 9.2(12) | 10(1) |
| C13 | 34.3(13) | 16.0(11) | 53.3(17) | 12.8(11) | 17.0(12) | 10.5(10) |
| C14 | 32.1(13) | 26.0(12) | 36.8(14) | 17.8(11) | 16.3(11) | 12.3(10) |
| C15 | 21.4(10) | 18.3(10) | 26.4(12) | 7.4(9) | 11.6(9) | 6.3(8) |
| C16 | 18.8(10) | 21.2(10) | 12.8(10) | 3.8(8) | 7.7(8) | 8.2(8) |
| C17 | 15.5(10) | 21.2(11) | 21.1(11) | 2.6(8) | 4.8(8) | 5.1(8) |
| C18 | 17.0(9) | 17.7(10) | 14.7(10) | −0.5(8) | 8.1(8) | 5.2(8) |
| C19 | 19.5(10) | 21.2(10) | 14.7(10) | 3.1(8) | 4.1(8) | 6.7(8) |
| C20 | 20(1) | 22.2(11) | 22.3(11) | 4.8(9) | 9.2(9) | 7.1(9) |
| C21 | 30.7(12) | 21.6(11) | 29.5(13) | 9.9(10) | 13.5(10) | 8.6(9) |
| C22 | 31.4(13) | 27.7(13) | 41.5(15) | 14.1(11) | 8.2(11) | 15.4(11) |
| C23 | 20.9(12) | 35.6(14) | 53.4(17) | 19.2(13) | 5.3(11) | 11.8(11) |
| C24 | 18.5(11) | 26.2(12) | 40.5(14) | 12.9(11) | 5.7(10) | 6.8(9) |
| C25 | 18.3(10) | 17.3(10) | 22.5(11) | 0.1(8) | 7.9(8) | 6.5(8) |
| C26 | 24.6(11) | 22.2(11) | 28.4(12) | 5.3(9) | 9(1) | 6.2(9) |
| C27 | 34.9(14) | 24.0(12) | 43.1(16) | 11.0(11) | 12.8(12) | 7.4(11) |
| C28 | 29.4(13) | 20.6(12) | 65(2) | 5.9(12) | 13.6(13) | 1.6(10) |
| C29 | 21.6(12) | 23.0(12) | 56.2(18) | −1.7(12) | −2.8(12) | 3.9(10) |
| C30 | 20.2(11) | 19.8(11) | 36.8(14) | 0.6(10) | 3.1(10) | 7.2(9) |
| C31 | 14.5(10) | 34.6(13) | 17.5(11) | −3.8(9) | 2.6(8) | 9.6(9) |
| C32 | 12.6(10) | 37.2(13) | 17.0(11) | −2.2(9) | 2.5(8) | 5.9(9) |
| C33 | 18.1(10) | 33.5(13) | 21.4(11) | 6.6(10) | 4.9(9) | 4.2(9) |
| C34 | 20.5(11) | 44.8(15) | 21.7(12) | 11.8(11) | 3.7(9) | 0.4(10) |
| C35 | 17.4(11) | 59.9(18) | 18.8(12) | 6.3(11) | 6.9(9) | 1.0(11) |
| C36 | 16.7(10) | 52.8(16) | 16.2(11) | −0.2(11) | 5.5(9) | 7.5(10) |
| C37 | 21.6(12) | 72(2) | 19.3(12) | −3.0(13) | 9(1) | 16.6(13) |
| C38 | 25.6(12) | 63.4(19) | 24.6(13) | −5.8(13) | 7.3(10) | 23.0(13) |
| C39 | 21.3(11) | 44.9(15) | 22.0(12) | −7.6(11) | 3.4(9) | 15.6(11) |
| C40 | 30.2(13) | 40.6(15) | 33.6(14) | −8.7(11) | 2.9(11) | 23.4(12) |
| C41 | 32.4(13) | 31.8(13) | 35.2(14) | −0.6(11) | 5.2(11) | 20.1(11) |
| C42 | 25.8(11) | 28.7(12) | 25.2(12) | 1.6(10) | 6.1(10) | 15.5(10) |
| C43 | 24.1(11) | 16.4(10) | 22.0(11) | 0.1(8) | 4.9(9) | 8.7(8) |
| Cl1 | 59.6(5) | 28.3(3) | 66.5(5) | 11.6(3) | 46.0(4) | 11.7(3) |
| Cl2 | 34.5(3) | 29.2(3) | 27.4(3) | 3.8(2) | 13.2(2) | 4.6(2) |
| C44 | 36.9(13) | 21.2(11) | 29.9(13) | 3.4(10) | 16.0(11) | 9.6(10) |

TABLE 4

| Bond Lengths for Example 1 | | |
|---|---|---|
| Atom | Atom | Length/Å |
| Eu1 | Eu1¹ | 3.7703(3) |
| Eu1 | O1 | 2.3804(14) |
| Eu1 | O2 | 2.3562(14) |
| Eu1 | O3 | 2.3947(15) |
| Eu1 | O4 | 2.3977(15) |
| Eu1 | O5¹ | 2.3271(14) |
| Eu1 | O5 | 2.3005(14) |
| Eu1 | N1 | 2.6518(18) |
| Eu1 | N2 | 2.6564(18) |
| O1 | C1 | 1.269(2) |
| O2 | C3 | 1.268(2) |
| O3 | C16 | 1.264(2) |
| O4 | C18 | 1.271(2) |
| O5 | C43 | 1.411(2) |
| N1 | C31 | 1.363(3) |
| N1 | C42 | 1.326(3) |
| N2 | C32 | 1.363(3) |
| N2 | C33 | 1.321(3) |
| C1 | C2 | 1.405(3) |
| C1 | C4 | 1.497(3) |
| C2 | C3 | 1.403(3) |
| C3 | C10 | 1.498(3) |
| C4 | C5 | 1.395(3) |
| C4 | C9 | 1.400(3) |
| C5 | C6 | 1.388(3) |
| C6 | C7 | 1.387(3) |
| C7 | C8 | 1.389(3) |
| C8 | C9 | 1.390(3) |
| C10 | C11 | 1.393(3) |
| C10 | C15 | 1.392(3) |
| C11 | C12 | 1.385(3) |
| C12 | C13 | 1.382(4) |
| C13 | C14 | 1.381(4) |
| C14 | C15 | 1.391(3) |
| C16 | C17 | 1.405(3) |
| C16 | C19 | 1.503(3) |
| C17 | C18 | 1.401(3) |
| C18 | C25 | 1.504(3) |
| C19 | C20 | 1.395(3) |
| C19 | C24 | 1.398(3) |
| C20 | C21 | 1.385(3) |
| C21 | C22 | 1.387(3) |
| C22 | C23 | 1.385(4) |
| C23 | C24 | 1.391(3) |
| C25 | C26 | 1.393(3) |
| C25 | C30 | 1.396(3) |
| C26 | C27 | 1.389(3) |
| C27 | C28 | 1.387(4) |
| C28 | C29 | 1.380(4) |
| C29 | C30 | 1.386(3) |
| C31 | C32 | 1.441(4) |
| C31 | C39 | 1.413(3) |
| C32 | C36 | 1.410(3) |
| C33 | C34 | 1.405(3) |
| C34 | C35 | 1.369(4) |
| C35 | C36 | 1.397(4) |
| C36 | C37 | 1.437(4) |
| C37 | C38 | 1.338(4) |
| C38 | C39 | 1.431(4) |
| C39 | C40 | 1.398(4) |
| C40 | C41 | 1.368(4) |
| C41 | C42 | 1.406(3) |
| Cl1 | C44 | 1.761(2) |
| Cl2 | C44 | 1.765(2) |

¹1-X, 1-Y, 1-Z

TABLE 5

| Bond Angles for Example 1. | | | | | | | |
|---|---|---|---|---|---|---|---|
| Atom | Atom | Atom | Angle/° | Atom | Atom | Atom | Angle/° |
| O1 | Eu1 | Eu1¹ | 96.20(4) | C9 | C4 | C1 | 123.11(18) |
| O1 | Eu1 | O3 | 82.11(5) | C6 | C5 | C4 | 120.9(2) |
| O1 | Eu1 | O4 | 89.49(5) | C7 | C6 | C5 | 120.0(2) |
| O1 | Eu1 | N1 | 144.44(5) | C6 | C7 | C8 | 119.99(19) |
| O1 | Eu1 | N2 | 152.23(5) | C7 | C8 | C9 | 119.9(2) |
| O2 | Eu1 | Eu1¹ | 102.47(3) | C8 | C9 | C4 | 120.6(2) |
| O2 | Eu1 | O1 | 71.63(5) | C11 | C10 | C3 | 118.9(2) |
| O2 | Eu1 | O3 | 73.90(5) | C15 | C10 | C3 | 121.80(19) |
| O2 | Eu1 | O4 | 140.94(5) | C15 | C10 | C11 | 119.0(2) |
| O2 | Eu1 | N1 | 78.66(5) | C12 | C11 | C10 | 120.5(2) |
| O2 | Eu1 | N2 | 135.65(5) | C13 | C12 | C11 | 120.0(2) |
| O3 | Eu1 | Eu1¹ | 176.31(4) | C14 | C13 | C12 | 120.1(2) |
| O3 | Eu1 | O4 | 69.75(5) | C13 | C14 | C15 | 120.0(2) |
| O3 | Eu1 | N1 | 71.05(5) | C10 | C15 | C14 | 120.3(2) |
| O3 | Eu1 | N2 | 107.97(5) | O3 | C16 | C17 | 124.00(19) |
| O4 | Eu1 | Eu1¹ | 113.60(3) | O3 | C16 | C19 | 115.48(18) |
| O4 | Eu1 | N1 | 102.11(5) | C17 | C16 | C19 | 120.50(19) |
| O4 | Eu1 | N2 | 70.99(5) | C18 | C17 | C16 | 123.43(19) |
| O5 | Eu1 | Eu1¹ | 35.67(3) | O4 | C18 | C17 | 124.13(19) |
| O5¹ | Eu1 | Eu1¹ | 35.20(3) | O4 | C18 | C25 | 116.20(18) |
| O5¹ | Eu1 | O1 | 111.37(5) | C17 | C18 | C25 | 119.61(19) |
| O5 | Eu1 | O1 | 78.96(5) | C20 | C19 | C16 | 118.53(19) |
| O5¹ | Eu1 | O2 | 77.73(5) | C20 | C19 | C24 | 118.0(2) |
| O5 | Eu1 | O2 | 124.67(5) | C24 | C19 | C16 | 123.2(2) |
| O5¹ | Eu1 | O3 | 142.63(5) | C21 | C20 | C19 | 121.3(2) |
| O5 | Eu1 | O3 | 146.26(5) | C20 | C21 | C22 | 120.1(2) |
| O5¹ | Eu1 | O4 | 141.27(5) | C23 | C22 | C21 | 119.4(2) |
| O5 | Eu1 | O4 | 82.35(5) | C22 | C23 | C24 | 120.4(2) |
| O5 | Eu1 | O5¹ | 70.88(5) | C23 | C24 | C19 | 120.7(2) |
| O5¹ | Eu1 | N1 | 79.99(5) | C26 | C25 | C18 | 119.0(2) |
| O5 | Eu1 | N1 | 135.45(5) | C26 | C25 | C30 | 118.2(2) |
| O5 | Eu1 | N2 | 79.00(5) | C30 | C25 | C18 | 122.8(2) |
| O5¹ | Eu1 | N2 | 76.69(5) | C27 | C26 | C25 | 120.9(2) |
| N1 | Eu1 | Eu1¹ | 109.12(4) | C28 | C27 | C26 | 120.1(2) |
| N1 | Eu1 | N2 | 61.65(6) | C29 | C28 | C27 | 119.6(2) |
| N2 | Eu1 | Eu1¹ | 75.02(4) | C28 | C29 | C30 | 120.4(2) |
| C1 | O1 | Eu1 | 134.27(13) | C29 | C30 | C25 | 120.8(2) |
| C3 | O2 | Eu1 | 130.47(13) | N1 | C31 | C32 | 118.01(19) |
| C16 | O3 | Eu1 | 130.63(13) | N1 | C31 | C39 | 122.2(2) |
| C18 | O4 | Eu1 | 134.49(13) | C39 | C31 | C32 | 119.8(2) |
| Eu1 | O5 | Eu1¹ | 109.12(5) | N2 | C32 | C31 | 118.0(2) |
| C43 | O5 | Eu1¹ | 127.35(12) | N2 | C32 | C36 | 122.7(2) |
| C43 | O5 | Eu1 | 122.88(12) | C36 | C32 | C31 | 119.3(2) |
| C31 | N1 | Eu1 | 120.85(15) | N2 | C33 | C34 | 123.3(2) |
| C42 | N1 | Eu1 | 120.87(15) | C35 | C34 | C33 | 118.9(2) |
| C42 | N1 | C31 | 118.00(19) | C34 | C35 | C36 | 119.8(2) |
| C32 | N2 | Eu1 | 120.75(15) | C32 | C36 | C37 | 119.0(3) |
| C33 | N2 | Eu1 | 121.17(15) | C35 | C36 | C32 | 117.5(2) |
| C33 | N2 | C32 | 117.8(2) | C35 | C36 | C37 | 123.5(2) |
| O1 | C1 | C2 | 124.43(18) | C38 | C37 | C36 | 121.7(2) |
| O1 | C1 | C4 | 115.88(17) | C37 | C38 | C39 | 121.1(2) |
| C2 | C1 | C4 | 119.68(18) | C31 | C39 | C38 | 119.2(3) |
| C3 | C2 | C1 | 123.35(19) | C40 | C39 | C31 | 117.7(2) |
| O2 | C3 | C2 | 124.71(18) | C40 | C39 | C38 | 123.1(2) |
| O2 | C3 | C10 | 115.47(18) | C41 | C40 | C39 | 120.1(2) |
| C2 | C3 | C10 | 119.82(18) | C40 | C41 | C42 | 118.5(3) |
| C5 | C4 | C1 | 118.36(18) | N1 | C42 | C41 | 123.5(2) |
| C5 | C4 | C9 | 118.53(19) | Cl1 | C44 | Cl2 | 110.20(13) |

¹1-X, 1-Y, 1-Z

TABLE 6

Torsion Angles for Example 1

| A | B | C | D | Angle/° | A | B | C | D | Angle/° |
|---|---|---|---|---|---|---|---|---|---|
| Eu1 | O1 | C1 | C2 | 7.4(3) | C12 | C13 | C14 | C15 | 0.7(4) |
| Eu1 | O1 | C1 | C4 | −173.86(12) | C13 | C14 | C15 | C10 | 1.2(3) |
| Eu1 | O2 | C3 | C2 | −37.8(3) | C15 | C10 | C11 | C12 | 0.8(3) |
| Eu1 | O2 | C3 | C10 | 142.86(14) | C16 | C17 | C18 | O4 | 3.7(3) |
| Eu1 | O3 | C16 | C17 | −40.1(3) | C16 | C17 | C18 | C25 | −179.10(19) |
| Eu1 | O3 | C16 | C19 | 138.61(15) | C16 | C19 | C20 | C21 | −175.1(2) |
| Eu1 | O4 | C18 | C17 | 17.2(3) | C16 | C19 | C24 | C23 | 173.7(2) |
| Eu1 | O4 | C18 | C25 | −160.06(13) | C17 | C16 | C19 | C20 | −168.6(2) |
| Eu1 | N1 | C31 | C32 | −7.6(3) | C17 | C16 | C19 | C24 | 17.5(3) |
| Eu1 | N1 | C31 | C39 | 172.52(16) | C17 | C18 | C25 | C26 | −164.0(2) |
| Eu1 | N1 | C42 | C41 | −173.54(18) | C17 | C18 | C25 | C30 | 15.8(3) |
| Eu1 | N2 | C32 | C31 | 6.6(3) | C18 | C25 | C26 | C27 | 178.5(2) |
| Eu1 | N2 | C32 | C36 | −173.88(16) | C18 | C25 | C30 | C29 | −178.6(2) |
| Eu1 | N2 | C33 | C34 | 174.08(17) | C19 | C16 | C17 | C18 | −170.63(19) |
| O1 | C1 | C2 | C3 | 9.5(3) | C19 | C20 | C21 | C22 | 1.4(4) |
| O1 | C1 | C4 | C5 | −21.3(3) | C19 | C24 | C23 | C22 | −0.3(4) |
| O1 | C1 | C4 | C9 | 158.36(19) | C20 | C21 | C22 | C23 | −0.8(4) |
| O2 | C3 | C10 | C11 | 24.4(3) | C21 | C22 | C23 | C24 | −0.2(4) |
| O2 | C3 | C10 | C15 | −149.1(2) | C22 | C23 | C24 | C19 | 0.8(4) |
| O3 | C16 | C17 | C18 | 8.0(3) | C24 | C19 | C20 | C21 | −0.8(3) |
| O3 | C16 | C19 | C20 | 12.6(3) | C25 | C26 | C27 | C28 | 0.6(4) |
| O3 | C16 | C19 | C24 | −161.3(2) | C26 | C25 | C30 | C29 | 1.2(4) |
| O4 | C18 | C25 | C26 | 13.4(3) | C26 | C27 | C28 | C29 | 0.4(4) |
| O4 | C18 | C25 | C30 | −166.8(2) | C27 | C28 | C29 | C30 | −0.6(4) |
| N1 | C31 | C32 | N2 | 0.7(3) | C28 | C29 | C30 | C25 | −0.2(4) |
| N1 | C31 | C32 | C36 | −178.9(2) | C30 | C25 | C26 | C27 | −1.4(3) |
| N1 | C31 | C39 | C38 | −179.6(2) | C31 | N1 | C42 | C41 | 0.4(3) |
| N1 | C31 | C39 | C40 | 1.1(3) | C31 | C32 | C36 | C35 | 179.4(2) |
| N2 | C32 | C36 | C35 | −0.2(3) | C31 | C32 | C36 | C37 | −1.5(3) |
| N2 | C32 | C36 | C37 | 178.9(2) | C31 | C39 | C40 | C41 | 0.2(4) |
| N2 | C33 | C34 | C35 | −0.3(4) | C32 | N2 | C33 | C34 | 0.2(3) |
| C1 | C2 | C3 | O2 | 5.9(3) | C32 | C31 | C39 | C38 | 0.5(3) |
| C1 | C2 | C3 | C10 | −174.79(19) | C32 | C31 | C39 | C40 | −178.8(2) |
| C1 | C4 | C5 | C6 | −179.78(19) | C32 | C36 | C37 | C38 | 0.5(4) |
| C1 | C4 | C9 | C8 | −178.62(19) | C33 | N2 | C32 | C31 | −179.5(2) |
| C2 | C1 | C4 | C5 | 157.46(19) | C33 | N2 | C32 | C36 | 0.0(3) |
| C2 | C1 | C4 | C9 | −22.9(3) | C33 | C34 | C35 | C36 | 0.2(4) |
| C2 | C3 | C10 | C11 | −155.0(2) | C34 | C35 | C36 | C32 | 0.0(3) |
| C2 | C3 | C10 | C15 | 31.5(3) | C34 | C35 | C36 | C37 | −179.0(2) |
| C3 | C10 | C11 | C12 | −172.9(2) | C35 | C36 | C37 | C38 | 179.5(2) |
| C3 | C10 | C15 | C14 | 171.6(2) | C36 | C37 | C38 | C39 | 1.1(4) |
| C4 | C1 | C2 | C3 | −169.17(19) | C37 | C38 | C39 | C31 | −1.6(4) |
| C4 | C5 | C6 | C7 | −1.6(3) | C37 | C38 | C39 | C40 | 177.7(2) |
| C5 | C4 | C9 | C8 | 1.1(3) | C38 | C39 | C40 | C41 | −179.1(2) |
| C5 | C6 | C7 | C8 | 1.0(3) | C39 | C31 | C32 | N2 | −179.5(2) |
| C6 | C7 | C8 | C9 | 0.6(3) | C39 | C31 | C32 | C36 | 1.0(3) |
| C7 | C8 | C9 | C4 | −1.6(3) | C39 | C40 | C41 | C42 | −1.2(4) |
| C9 | C4 | C5 | C6 | 0.5(3) | C40 | C41 | C42 | N1 | 0.9(4) |
| C10 | C11 | C12 | C13 | 1.0(4) | C42 | N1 | C31 | C32 | 178.5(2) |
| C11 | C10 | C15 | C14 | −1.9(3) | C42 | N1 | C31 | C39 | −1.4(3) |
| C11 | C12 | C13 | C14 | −1.8(4) | | | | | |

TABLE 7

Hydrogen Atom Coordinates (Å × 10⁴) and Isotropic Displacement Parameters (Å² × 10³) for Example 1.

| Atom | x | y | z | U(eq) |
|---|---|---|---|---|
| H2 | 5927.52 | 6724.42 | 1620.83 | 20 |
| H5 | 6252.62 | 3431.02 | 2569.54 | 21 |
| H6 | 7097.91 | 2340.97 | 1714.11 | 25 |
| H7 | 7383.57 | 2796.19 | 245.62 | 25 |
| H8 | 6874.7 | 4381.51 | −344.26 | 23 |
| H9 | 6112.93 | 5529.02 | 547.42 | 21 |
| H11 | 5811.61 | 9131.94 | 3974.6 | 31 |
| H12 | 5642.48 | 10948.98 | 3680.98 | 40 |
| H13 | 5070.75 | 11277.61 | 2093.34 | 39 |
| H14 | 4764.52 | 9824.31 | 799.98 | 35 |
| H15 | 4994.09 | 8019.32 | 1090.32 | 25 |
| H17 | 7.67 | 3791.25 | 1568.4 | 24 |
| H20 | 2700.28 | 7160.27 | 1562.46 | 25 |
| H21 | 1983.39 | 8643.79 | 996.54 | 31 |
| H22 | −84.56 | 8454.82 | 670.26 | 39 |
| H23 | −1431.92 | 6746.86 | 876.98 | 44 |
| H24 | −727.25 | 5231.55 | 1398.12 | 34 |
| H26 | 1438.03 | 1599.1 | 3547.04 | 30 |
| H27 | 99.18 | −244.36 | 3490.89 | 41 |
| H28 | −1779.3 | −964.44 | 2276.22 | 48 |
| H29 | −2297.64 | 159.81 | 1114.52 | 45 |
| H30 | −970.81 | 2004.17 | 1170.16 | 32 |
| H33 | 2776.51 | 3054.93 | 5083.6 | 30 |
| H34 | 1695.54 | 2558.61 | 6192.24 | 38 |
| H35 | 811.84 | 3858.32 | 6750.29 | 41 |
| H37 | 426.8 | 5817.76 | 6735.12 | 45 |
| H38 | 673.86 | 7535.26 | 6177.9 | 44 |
| H40 | 1438.9 | 8830.96 | 5054.69 | 41 |

TABLE 7-continued

Hydrogen Atom Coordinates (Å × 104) and Isotropic Displacement Parameters (Å2 × 103) for Example 1.

| Atom | x | y | z | U(eq) |
|---|---|---|---|---|
| H41 | 2458.91 | 9130.42 | 3894.07 | 39 |
| H42 | 3309.76 | 7729.21 | 3441.34 | 31 |
| H43A | 3849.13 | 2468.3 | 3618.47 | 31 |
| H43B | 4621.59 | 2215.7 | 4609.05 | 31 |
| H43C | 5297.18 | 2793.33 | 3873.07 | 31 |
| H44A | 3599.54 | 2846.84 | 1696.24 | 34 |
| H44B | 2360.8 | 2892.06 | 963.1 | 34 |

TABLE 8

Crystal data and structure refinement for Example 3

| | |
|---|---|
| Empirical formula | $C_{86}H_{66}Eu_2N_4O_{10}$ |
| Formula weight | 1619.34 |
| Temperature/K | 100(2) |
| Crystal system | orthorhombic |
| Space group | Pbca |
| a/Å | 20.0604(6) |
| b/Å | 16.0557(4) |
| c/Å | 21.9655(6) |
| α/° | 90 |
| β/° | 90 |
| γ/° | 90 |
| Volume/Å$^3$ | 7074.7(3) |
| Z | 4 |
| $\rho_{calc}$g/cm$^3$ | 1.520 |
| μ/mm$^{-1}$ | 1.822 |
| F(000) | 3264.0 |
| Crystal size/mm$^3$ | 0.47 × 0.44 × 0.36 |
| Radiation | MoKα (λ = 0.71073) |
| 2Θ range for data collection/° | 4.228 to 55.202 |
| Index ranges | −26 ≤ h ≤ 26, −20 ≤ k ≤ 20, −28 ≤ l ≤ 28 |
| Reflections collected | 146386 |
| Independent reflections | 8184 [$R_{int}$ = 0.0681, $R_{sigma}$ = 0.0242] |
| Data/restraints/parameters | 8184/0/461 |
| Goodness-of-fit on F$^2$ | 1.253 |
| Final R indexes [I >= 2σ (I)] | $R_1$ = 0.0473, $wR_2$ = 0.0941 |
| Final R indexes [all data] | $R_1$ = 0.0606, $wR_2$ = 0.0981 |
| Largest diff. peak/hole/e Å$^{-3}$ | 1.75/−1.04 |

TABLE 9

Fractional Atomic Coordinates (×10$^4$) and Equivalent Isotropic Displacement Parameters (Å$^2$ × 10$^3$) for Example 3. $U_{eq}$ is defined as ⅓ of the trace of the orthogonalised $U_{IJ}$ tensor.

| Atom | x | y | z | U(eq) |
|---|---|---|---|---|
| Eu1 | 4847.9(2) | 4062.1(2) | 5505.7(2) | 17.66(7) |
| O1 | 3680.5(15) | 4042(2) | 5476.0(16) | 25.3(7) |
| O2 | 4444.8(16) | 4748(2) | 6390.4(15) | 20.7(7) |
| O3 | 4556.5(18) | 2927(2) | 6158.5(16) | 25.1(8) |
| O4 | 4766.3(17) | 2828(2) | 4914.5(15) | 22.2(7) |
| O5 | 4639.4(15) | 4643.5(19) | 4568.0(15) | 18.8(7) |
| N1 | 5847(2) | 3782(3) | 6263.6(19) | 20.9(9) |
| N2 | 6018(2) | 3705(2) | 5037.9(19) | 20.9(9) |
| C1 | 3201(2) | 4206(3) | 5829(2) | 18.0(9) |
| C2 | 3273(2) | 4589(3) | 6398(2) | 20(1) |
| C3 | 3880(2) | 4878(3) | 6624(2) | 17.1(9) |
| C4 | 2522(2) | 3988(3) | 5586(2) | 21.2(10) |
| C5 | 2477(3) | 3680(4) | 5000(2) | 32.9(13) |
| C6 | 1866(3) | 3463(4) | 4751(3) | 36.3(14) |
| C7 | 1289(3) | 3569(4) | 5085(3) | 33.6(13) |
| C8 | 1327(3) | 3867(4) | 5669(3) | 44.0(17) |
| C9 | 1939(3) | 4066(4) | 5919(3) | 40.9(15) |
| C10 | 3875(2) | 5441(3) | 7173(2) | 19.5(10) |
| C11 | 4397(2) | 6016(3) | 7238(2) | 20.8(10) |
| C12 | 4411(3) | 6561(3) | 7726(2) | 22.9(10) |
| C13 | 3919(3) | 6532(3) | 8159(2) | 29.6(12) |
| C14 | 3405(3) | 5957(4) | 8111(3) | 37.4(14) |
| C15 | 3380(3) | 5425(3) | 7615(2) | 29.2(12) |
| C16 | 4275(2) | 2233(3) | 6082(2) | 18.5(9) |
| C17 | 4266(2) | 1791(3) | 5529(2) | 19.8(9) |
| C18 | 4535(2) | 2097(3) | 4981(2) | 19.1(10) |
| C19 | 3945(2) | 1866(3) | 6631(2) | 21.4(10) |
| C20 | 3802(3) | 2375(4) | 7117(3) | 36.6(14) |
| C21 | 3519(4) | 2062(4) | 7644(3) | 45.3(16) |
| C22 | 3379(3) | 1237(4) | 7697(3) | 37.1(14) |
| C23 | 3506(4) | 725(4) | 7213(3) | 46.1(17) |
| C24 | 3789(3) | 1029(3) | 6686(3) | 37.3(14) |
| C25 | 4578(2) | 1545(3) | 4429(2) | 20.8(10) |
| C26 | 4674(3) | 1905(3) | 3861(2) | 26.5(11) |
| C27 | 4742(3) | 1421(3) | 3349(2) | 29.3(12) |
| C28 | 4734(3) | 569(3) | 3397(3) | 35.3(14) |
| C29 | 4637(3) | 196(3) | 3964(3) | 31.4(13) |
| C30 | 4551(3) | 682(3) | 4473(3) | 26.7(11) |
| C31 | 6478(2) | 3709(3) | 6048(2) | 24.3(11) |
| C32 | 6569(2) | 3671(3) | 5394(2) | 24.4(11) |
| C33 | 6100(3) | 3608(3) | 4444(2) | 24.7(10) |
| C34 | 6725(3) | 3476(4) | 4171(3) | 31.8(13) |
| C35 | 7282(3) | 3481(4) | 4528(3) | 39.0(14) |
| C36 | 7215(3) | 3576(3) | 5157(3) | 34.2(13) |
| C37 | 7771(3) | 3565(5) | 5572(3) | 46.8(17) |
| C38 | 7690(3) | 3603(4) | 6173(3) | 42.3(15) |
| C39 | 7035(3) | 3649(3) | 6438(3) | 31.0(12) |
| C40 | 6917(3) | 3614(3) | 7066(3) | 32.0(13) |
| C41 | 6275(3) | 3664(3) | 7274(3) | 32.1(12) |
| C42 | 5753(3) | 3772(3) | 6861(2) | 26.9(11) |
| C43 | 4179(2) | 4316(3) | 4141(2) | 24.0(11) |

TABLE 10

Anisotropic Displacement Parameters (Å$^2$ × 10$^3$) for Example 3. The Anisotropic displacement factor exponent takes the form: −2π$^2$[h$^2$a*$^2$$U_{11}$ + 2hka*b*$U_{12}$ + ...].

| Atom | $U_{11}$ | $U_{22}$ | $U_{33}$ | $U_{23}$ | $U_{13}$ | $U_{12}$ |
|---|---|---|---|---|---|---|
| Eu1 | 14.0(1) | 15.39(11) | 23.60(12) | −3.34(10) | 2.51(10) | −1.74(9) |
| O1 | 15.3(15) | 34.2(19) | 26.4(17) | −9.4(17) | 2.9(14) | −4.5(15) |
| O2 | 13.7(15) | 20.3(17) | 28.3(18) | −5.7(14) | 3.2(14) | −2.7(13) |
| O3 | 28.5(19) | 18.3(17) | 28.6(19) | −2.5(14) | 1.9(16) | −8.7(15) |
| O4 | 22.6(18) | 17.1(16) | 27.0(17) | −2.7(14) | 4.7(15) | −1.5(14) |
| O5 | 13.2(14) | 16.4(15) | 26.9(18) | −2.1(14) | −0.5(14) | −3.3(12) |
| N1 | 15.7(19) | 19(2) | 28(2) | 1.2(17) | −1.0(17) | −0.6(16) |
| N2 | 16.8(19) | 16.2(19) | 30(2) | 1.5(17) | 6.2(17) | 3.3(16) |
| C1 | 14(2) | 16(2) | 24(2) | 0.9(18) | 2.0(18) | −2.0(17) |
| C2 | 16(2) | 22(2) | 22(2) | −0.4(19) | 4.5(19) | −3.2(19) |
| C3 | 17(2) | 16(2) | 18(2) | 2.3(18) | 2.1(18) | −2.0(18) |
| C4 | 16(2) | 18(2) | 30(3) | 1(2) | 1.5(19) | −2.6(18) |

TABLE 10-continued

Anisotropic Displacement Parameters ($Å^2 \times 10^3$) for Example 3. The Anisotropic displacement factor exponent takes the form: $-2\pi^2[h^2a^{*2}U_{11} + 2hka^*b^*U_{12} + \ldots ]$.

| Atom | $U_{11}$ | $U_{22}$ | $U_{33}$ | $U_{23}$ | $U_{13}$ | $U_{12}$ |
|---|---|---|---|---|---|---|
| C5  | 20(3) | 52(4) | 27(3) | 1(3)    | 2(2)     | −12(3) |
| C6  | 30(3) | 55(4) | 24(3) | 2(3)    | −3(2)    | −15(3) |
| C7  | 19(3) | 38(3) | 45(3) | 0(3)    | −10(2)   | −6(2)  |
| C8  | 16(2) | 57(4) | 59(4) | −25(3)  | 8(3)     | −6(3)  |
| C9  | 20(3) | 60(4) | 43(3) | −28(3)  | 4(2)     | −8(3)  |
| C10 | 17(2) | 22(2) | 20(2) | −1.0(19)| −4.7(19) | 0.9(19)|
| C11 | 21(2) | 18(2) | 23(2) | 2(2)    | −0.2(19) | 1(2)   |
| C12 | 27(3) | 15(2) | 27(3) | 0.0(19) | −9(2)    | −1.4(19)|
| C13 | 34(3) | 28(3) | 27(3) | −10(2)  | −7(2)    | 3(2)   |
| C14 | 26(3) | 57(4) | 30(3) | −17(3)  | 7(2)     | −6(3)  |
| C15 | 20(3) | 37(3) | 31(3) | −8(2)   | 2(2)     | −8(2)  |
| C16 | 13(2) | 18(2) | 25(2) | 1.8(19) | −0.3(19) | 1.7(18)|
| C17 | 17(2) | 15(2) | 27(2) | −1(2)   | 1(2)     | −2.7(17)|
| C18 | 13(2) | 14(2) | 31(3) | −3.7(19)| −1.1(19) | 3.8(17)|
| C19 | 16(2) | 21(2) | 28(3) | 2(2)    | −4(2)    | 0.3(19)|
| C20 | 49(4) | 28(3) | 33(3) | 0(2)    | 12(3)    | −7(3)  |
| C21 | 59(4) | 44(3) | 32(3) | −4(3)   | 13(3)    | −5(3)  |
| C22 | 35(3) | 49(4) | 28(3) | 11(3)   | 2(2)     | −8(3)  |
| C23 | 72(5) | 26(3) | 40(4) | 10(3)   | 5(3)     | −13(3) |
| C24 | 60(4) | 21(3) | 31(3) | 2(2)    | 8(3)     | −3(3)  |
| C25 | 15(2) | 20(2) | 27(3) | −5(2)   | −1(2)    | 1.3(18)|
| C26 | 29(3) | 20(2) | 31(3) | −4(2)   | 5(2)     | 4(2)   |
| C27 | 30(3) | 33(3) | 25(3) | −1(2)   | 3(2)     | 2(2)   |
| C28 | 38(3) | 34(3) | 34(3) | −17(2)  | −9(2)    | 3(3)   |
| C29 | 36(3) | 17(2) | 41(3) | −9(2)   | −9(3)    | 4(2)   |
| C30 | 27(3) | 22(2) | 31(3) | 0(2)    | −2(2)    | 4(2)   |
| C31 | 17(2) | 20(2) | 36(3) | 5(2)    | 4(2)     | 0.9(19)|
| C32 | 18(2) | 19(2) | 36(3) | 3(2)    | 0(2)     | 1.0(19)|
| C33 | 24(2) | 21(2) | 30(3) | 5(2)    | 6(2)     | 4.3(19)|
| C34 | 27(3) | 36(3) | 32(3) | 9(2)    | 13(2)    | 7(2)   |
| C35 | 23(3) | 53(4) | 42(3) | 12(3)   | 15(3)    | 8(3)   |
| C36 | 18(3) | 42(3) | 43(3) | 9(3)    | 7(2)     | 3(2)   |
| C37 | 15(2) | 72(5) | 53(4) | 8(4)    | 2(3)     | 7(3)   |
| C38 | 21(3) | 54(4) | 52(4) | 7(3)    | −6(3)    | 1(3)   |
| C39 | 23(3) | 28(3) | 42(3) | 5(2)    | −5(2)    | 0(2)   |
| C40 | 26(3) | 30(3) | 40(3) | 1(2)    | −14(2)   | −2(2)  |
| C41 | 36(3) | 29(3) | 31(3) | 0(2)    | −3(2)    | −4(2)  |
| C42 | 26(3) | 24(2) | 31(3) | −6(2)   | 2(2)     | −3(2)  |
| C43 | 19(2) | 21(2) | 32(3) | −4(2)   | −5(2)    | −4.5(19)|

TABLE 11

Bond Lengths for Example 3.

| Atom | Atom | Length/Å |
|---|---|---|
| Eu1 | Eu1[1] | 3.7918(5) |
| Eu1 | O1 | 2.343(3) |
| Eu1 | O2 | 2.376(3) |
| Eu1 | O3 | 2.391(3) |
| Eu1 | O4 | 2.375(3) |
| Eu1 | O5 | 2.300(3) |
| Eu1 | O5[1] | 2.324(3) |
| Eu1 | N1 | 2.644(4) |
| Eu1 | N2 | 2.626(4) |
| O1 | C1 | 1.262(5) |
| O2 | C3 | 1.261(5) |
| O3 | C16 | 1.261(6) |
| O4 | C18 | 1.270(5) |
| O5 | C43 | 1.417(5) |
| N1 | C31 | 1.356(6) |
| N1 | C42 | 1.325(7) |
| N2 | C32 | 1.356(6) |
| N2 | C33 | 1.323(7) |
| C1 | C2 | 1.401(7) |
| C1 | C4 | 1.504(6) |
| C2 | C3 | 1.394(6) |
| C3 | C10 | 1.508(6) |
| C4 | C5 | 1.381(7) |
| C4 | C9 | 1.385(7) |
| C5 | C6 | 1.386(7) |
| C6 | C7 | 1.380(8) |
| C7 | C8 | 1.371(9) |
| C8 | C9 | 1.383(8) |
| C10 | C11 | 1.403(7) |
| C10 | C15 | 1.388(7) |
| C11 | C12 | 1.383(7) |
| C12 | C13 | 1.373(8) |
| C13 | C14 | 1.387(8) |
| C14 | C15 | 1.385(7) |
| C16 | C17 | 1.407(7) |
| C16 | C19 | 1.497(7) |
| C17 | C18 | 1.409(7) |
| C18 | C25 | 1.503(7) |
| C19 | C20 | 1.375(8) |
| C19 | C24 | 1.385(7) |
| C20 | C21 | 1.383(8) |
| C21 | C22 | 1.359(9) |
| C22 | C23 | 1.368(9) |
| C23 | C24 | 1.379(8) |
| C25 | C26 | 1.389(7) |
| C25 | C30 | 1.390(7) |
| C26 | C27 | 1.374(7) |
| C27 | C28 | 1.372(8) |
| C28 | C29 | 1.395(8) |
| C29 | C30 | 1.375(7) |
| C31 | C32 | 1.448(7) |
| C31 | C39 | 1.412(7) |

TABLE 11-continued

Bond Lengths for Example 3.

| Atom | Atom | Length/Å |
|------|------|----------|
| C32 | C36 | 1.405(7) |
| C33 | C34 | 1.407(7) |
| C34 | C35 | 1.366(8) |
| C35 | C36 | 1.396(9) |
| C36 | C37 | 1.439(8) |
| C37 | C38 | 1.331(9) |
| C38 | C39 | 1.439(8) |
| C39 | C40 | 1.401(8) |
| C40 | C41 | 1.369(8) |
| C41 | C42 | 1.396(8) |

[1]1-X, 1-Y, 1-Z

TABLE 12

Bond Angles for Example 3.

| Atom | Atom | Atom | Angle/° | Atom | Atom | Atom | Angle/° |
|------|------|------|---------|------|------|------|---------|
| O1 | Eu1 | Eu1[1] | 98.93(9) | C9 | C4 | C1 | 123.8(5) |
| O1 | Eu1 | O2 | 71.88(11) | C4 | C5 | C6 | 121.1(5) |
| O1 | Eu1 | O3 | 76.23(13) | C7 | C6 | C5 | 120.0(5) |
| O1 | Eu1 | O4 | 84.52(12) | C8 | C7 | C6 | 119.5(5) |
| O1 | Eu1 | N1 | 140.61(13) | C7 | C8 | C9 | 120.1(5) |
| O1 | Eu1 | N2 | 151.61(13) | C8 | C9 | C4 | 121.3(5) |
| O2 | Eu1 | Eu1[1] | 99.53(8) | C11 | C10 | C3 | 118.1(4) |
| O2 | Eu1 | O3 | 77.28(12) | C15 | C10 | C3 | 123.5(4) |
| O2 | Eu1 | N1 | 79.75(12) | C15 | C10 | C11 | 118.3(5) |
| O2 | Eu1 | N2 | 136.51(12) | C12 | C11 | C10 | 120.7(5) |
| O3 | Eu1 | Eu1[1] | 174.81(9) | C13 | C12 | C11 | 120.1(5) |
| O3 | Eu1 | N1 | 71.22(12) | C12 | C13 | C14 | 120.2(5) |
| O3 | Eu1 | N2 | 106.67(12) | C15 | C14 | C13 | 119.9(5) |
| O4 | Eu1 | Eu1[1] | 110.70(8) | C14 | C15 | C10 | 120.8(5) |
| O4 | Eu1 | O2 | 144.17(11) | O3 | C16 | C17 | 124.5(4) |
| O4 | Eu1 | O3 | 71.04(11) | O3 | C16 | C19 | 116.0(4) |
| O4 | Eu1 | N1 | 104.74(12) | C17 | C16 | C19 | 119.5(4) |
| O4 | Eu1 | N2 | 70.47(12) | C16 | C17 | C18 | 123.9(4) |
| O5 | Eu1 | Eu1[1] | 35.13(8) | O4 | C18 | C17 | 124.1(4) |
| O5[1] | Eu1 | Eu1[1] | 34.70(8) | O4 | C18 | C25 | 115.5(4) |
| O5[1] | Eu1 | O1 | 116.90(12) | C17 | C18 | C25 | 120.4(4) |
| O5 | Eu1 | O1 | 78.39(12) | C20 | C19 | C16 | 119.0(5) |
| O5[1] | Eu1 | O2 | 78.05(11) | C20 | C19 | C24 | 117.6(5) |
| O5 | Eu1 | O2 | 118.84(11) | C24 | C19 | C16 | 123.4(5) |
| O5 | Eu1 | O3 | 143.31(11) | C19 | C20 | C21 | 121.3(5) |
| O5[1] | Eu1 | O3 | 146.23(12) | C22 | C21 | C20 | 120.7(6) |
| O5[1] | Eu1 | O4 | 137.60(11) | C21 | C22 | C23 | 118.7(6) |
| O5 | Eu1 | O4 | 80.59(11) | C22 | C23 | C24 | 121.1(6) |
| O5 | Eu1 | O5[1] | 69.83(13) | C23 | C24 | C19 | 120.6(5) |
| O5 | Eu1 | N1 | 140.44(12) | C26 | C25 | C18 | 119.1(4) |
| O5[1] | Eu1 | N1 | 81.99(12) | C26 | C25 | C30 | 118.8(5) |
| O5 | Eu1 | N2 | 84.31(12) | C30 | C25 | C18 | 122.0(5) |
| O5[1] | Eu1 | N2 | 76.84(12) | C27 | C26 | C25 | 120.9(5) |
| N1 | Eu1 | Eu1[1] | 112.47(9) | C28 | C27 | C26 | 120.1(5) |
| N2 | Eu1 | Eu1[1] | 78.47(9) | C27 | C28 | C29 | 119.8(5) |
| N2 | Eu1 | N1 | 62.06(13) | C30 | C29 | C28 | 119.9(5) |
| C1 | O1 | Eu1 | 137.8(3) | C29 | C30 | C25 | 120.4(5) |
| C3 | O2 | Eu1 | 135.7(3) | N1 | C31 | C32 | 118.0(5) |
| C16 | O3 | Eu1 | 134.7(3) | N1 | C31 | C39 | 122.2(5) |
| C18 | O4 | Eu1 | 137.2(3) | C39 | C31 | C32 | 119.9(5) |
| Eu1 | O5 | Eu1[1] | 110.17(13) | N2 | C32 | C31 | 117.8(4) |
| C43 | O5 | Eu1 | 124.1(3) | N2 | C32 | C36 | 122.8(5) |
| C43 | O5 | Eu1[1] | 125.0(3) | C36 | C32 | C31 | 119.3(5) |
| C31 | N1 | Eu1 | 120.1(3) | N2 | C33 | C34 | 123.3(5) |
| C42 | N1 | Eu1 | 121.2(3) | C35 | C34 | C33 | 118.8(5) |
| C42 | N1 | C31 | 118.5(5) | C34 | C35 | C36 | 119.4(5) |
| C32 | N2 | Eu1 | 120.8(3) | C32 | C36 | C37 | 118.7(5) |
| C33 | N2 | Eu1 | 121.4(3) | C35 | C36 | C32 | 117.9(5) |
| C33 | N2 | C32 | 117.7(4) | C35 | C36 | C37 | 123.4(5) |
| O1 | C1 | C2 | 124.2(4) | C38 | C37 | C36 | 122.3(6) |
| O1 | C1 | C4 | 115.0(4) | C37 | C38 | C39 | 120.9(6) |
| C2 | C1 | C4 | 120.8(4) | C31 | C39 | C38 | 118.8(5) |
| C3 | C2 | C1 | 123.6(4) | C40 | C39 | C31 | 117.8(5) |
| O2 | C3 | C2 | 125.8(4) | C40 | C39 | C38 | 123.4(5) |
| O2 | C3 | C10 | 115.5(4) | C41 | C40 | C39 | 119.0(5) |
| C2 | C3 | C10 | 118.6(4) | C40 | C41 | C42 | 119.8(5) |
| C5 | C4 | C1 | 118.3(4) | N1 | C42 | C41 | 122.6(5) |
| C5 | C4 | C9 | 117.9(5) | | | | |

[1]1-X, 1-Y, 1-Z

TABLE 13

Hydrogen Atom Coordinates (Å × 10^4) and Isotropic Displacement Parameters (Å^2 × 10^3) for Example 3.

| Atom | x | y | z | U(eq) |
|------|------|------|------|------|
| H2 | 2886.84 | 4654.94 | 6644.06 | 24 |
| H5 | 2870.37 | 3615.89 | 4764.41 | 40 |
| H6 | 1844.64 | 3242.09 | 4350.4 | 44 |
| H7 | 868.54 | 3436.44 | 4910.83 | 40 |
| H8 | 932.21 | 3937.16 | 5901.69 | 53 |
| H9 | 1960.52 | 4259.84 | 6327.13 | 49 |
| H11 | 4744.12 | 6031.12 | 6944.43 | 25 |
| H12 | 4762.21 | 6954.73 | 7760.78 | 27 |
| H13 | 3929.13 | 6907.95 | 8492.86 | 35 |
| H14 | 3072.07 | 5928.26 | 8417.02 | 45 |
| H15 | 3019.33 | 5045.64 | 7576 | 35 |
| H17 | 4066.02 | 1254.47 | 5525.18 | 24 |
| H20 | 3899.68 | 2952.81 | 7090.99 | 44 |
| H21 | 3421.88 | 2428.13 | 7972.24 | 54 |
| H22 | 3195.82 | 1020.59 | 8063.24 | 45 |
| H23 | 3396.46 | 150.75 | 7240.29 | 55 |
| H24 | 3878 | 660.64 | 6357.01 | 45 |
| H26 | 4692.71 | 2494.62 | 3825.96 | 32 |
| H27 | 4794.82 | 1675.86 | 2962.23 | 35 |
| H28 | 4794.99 | 233.52 | 3044.96 | 42 |
| H29 | 4630.06 | −394.09 | 3998.04 | 38 |
| H30 | 4471.6 | 427.22 | 4856.14 | 32 |
| H33 | 5716.59 | 3627.51 | 4190.46 | 30 |
| H34 | 6759.21 | 3385.68 | 3744.38 | 38 |
| H35 | 7710.9 | 3420.72 | 4350.78 | 47 |
| H37 | 8209.31 | 3530.16 | 5411.37 | 56 |
| H38 | 8070.75 | 3600.23 | 6430.52 | 51 |
| H40 | 7277.36 | 3556.56 | 7343.86 | 38 |
| H41 | 6184.63 | 3625.38 | 7697.23 | 39 |
| H42 | 5313.99 | 3841.53 | 7013.62 | 32 |
| H43A | 4161.5 | 3708.21 | 4181.44 | 36 |
| H43B | 4322.25 | 4461.98 | 3727.92 | 36 |
| H43C | 3736.32 | 4550.08 | 4218.14 | 36 |

What is claimed is:

1. A photoluminescent molecule comprising one or more rare earth ions selected from the group consisting of Europium, Gadolinium, Terbium, and mixtures thereof, each with ligands of dibenzoylmethane, 1,10-phenanthroline, and methoxide.

2. The photoluminescent molecule of claim 1, comprising one or more Europium ions with ligands of dibenzoylmethane, 1,10-phenanthroline, and methoxide, wherein the photoluminescent molecule absorbs light from the ultraviolet region through the blue region and in response emits red light characteristic of trivalent europium.

3. The photoluminescent molecule of claim 2, comprising one or more Gadolinium ions, each with ligands of dibenzoylmethane, 1,10-phenanthroline, and methoxide.

4. The photoluminescent molecule of claim 2, comprising one or more Terbium ions, each with ligands of dibenzoylmethane, 1,10-phenanthroline, and methoxide.

5. The photoluminescent molecule of claim 1, characterized by the molecular structure $RE_2(C_{15}H_{11}O_2)_4(C_{12}N_2)C_{12}H_8N_2)_2$;

wherein RE comprises Europium and optionally Praseodymium, Gadolinium, or Terbium; and wherein the photoluminescent molecule absorbs light from the ultraviolet region through the blue region and in response emits red light characteristic of trivalent europium.

6. The photoluminescent molecule of claim 5, crystalized in a triclinic crystal structure.

7. The photoluminescent molecule of claim 5, crystalized in an orthorhombic crystal structure.

8. The photoluminescent molecule of claim 1, characterized by the molecular structure $Eu_2(C_{15}H_{11}O_2)_4(C_{12}H_8N_2)_2(OCH_3)_2$.

9. The photoluminescent molecule of claim 8, crystalized in a triclinic crystal structure.

10. The photoluminescent molecule of claim 8, crystalized in an orthorhombic crystal structure.

11. The photoluminescent molecule of claim 1, derivatized to bind to a biological molecule.

12. An organic light emitting device, comprising the photoluminescent molecule of claim 1 as an emitter.

13. A light emitting device, comprising:
a semiconductor light emitting device emitting primary light; and
a phosphor material capable of absorbing at least a portion of the primary light and in response emitting secondary light having a wavelength longer than a wavelength of the primary light;
wherein the phosphor material comprises a photoluminescent molecule comprising one or more rare earth ions selected from the group consisting of Europium, Gadolinium, Terbium, and mixtures thereof, each with ligands of dibenzoylmethane, 1,10-phenanthroline, and methoxide.

14. The light emitting device of claim 13, wherein:
the photoluminescent molecule comprises one or more Europium ions with ligands of dibenzoylmethane, 1,10-phenanthroline, and methoxide; and
wherein the photoluminescent molecule absorbs light from the ultraviolet region through the blue region and in response emits red light characteristic of trivalent europium.

15. The light emitting device of claim 13, wherein:
the photoluminescent molecule is characterized by the molecular structure $RE_2(C_{15}H_{11}O_2)_4(C_{12}H_8N_2)_2(OCH_3)_2$;
RE comprises Europium and optionally Praseodymium, Gadolinium, or Terbium; and
the photoluminescent molecule absorbs light from the ultraviolet region through the blue region and in response emits red light characteristic of trivalent Europium.

16. The light emitting device of claim 15, wherein the photoluminescent molecule is crystalized in an orthorhombic crystal structure.

17. The light emitting device of claim 16, wherein the phosphor material comprises a green phosphor and light emitted from semiconductor light emitting device, the photoluminescent molecule, and the green phosphor combine to form a white light output from the light emitting device.

18. The light emitting device of claim 13, wherein:
the photoluminescent molecule is characterized by the molecular structure $Eu_2(C_{15}H_{11}O_2)_4(C_{12}H_8N_2)_2(OCH_3)_2$; and
the photoluminescent molecule absorbs light from the ultraviolet region through the blue region and in response emits red light characteristic of trivalent Europium.

19. The light emitting device of claim 18, wherein the photoluminescent molecule is crystalized in an orthorhombic crystal structure.

20. The light emitting device of claim 19, wherein the phosphor material comprises a green phosphor and light emitted from semiconductor light emitting device, the photoluminescent molecule, and the green phosphor combine to form a white light output from the light emitting device.

21. A molecule comprising one or more rare earth ions selected from the group consisting of Europium, Praseodymium, Gadolinium, Terbium, and mixtures thereof, each with ligands of dibenzoylmethane, 1,10-phenanthroline, and methoxide.

* * * * *

UNITED STATES PATENT AND TRADEMARK OFFICE
CERTIFICATE OF CORRECTION

PATENT NO. : 11,041,119 B2
APPLICATION NO. : 16/204719
DATED : June 29, 2021
INVENTOR(S) : Dino Sulemanvoic et al.

It is certified that error appears in the above-identified patent and that said Letters Patent is hereby corrected as shown below:

In the Claims

Claim 5 should read:
-- 5. The photoluminescent molecule of claim 1, characterized by the molecular structure $RE_2(C_{15}H_{11}O_2)_4(C_{12}H_8N_2)_2(OCH_3)_2$;
    wherein RE comprises Europium and optionally Praseodymium, Gadolinium, or Terbium; and
    wherein the photoluminescent molecule absorbs light from the ultraviolet region through the blue region and in response emits red light characteristic of trivalent europium. --

Signed and Sealed this
Thirty-first Day of August, 2021

Drew Hirshfeld
*Performing the Functions and Duties of the*
*Under Secretary of Commerce for Intellectual Property and*
*Director of the United States Patent and Trademark Office*